US011315648B2

(12) United States Patent
Lien et al.

(10) Patent No.: US 11,315,648 B2
(45) Date of Patent: Apr. 26, 2022

(54) DYNAMIC TIER SELECTION FOR PROGRAM VERIFY IN NONVOLATILE MEMORY

(71) Applicant: SanDisk Technologies LLC, Addison, TX (US)

(72) Inventors: Yu-Chung Lien, San Jose, CA (US); Dengtao Zhao, Los Gatos, CA (US); Huai-Yuan Tseng, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/915,663

(22) Filed: Jun. 29, 2020

(65) Prior Publication Data

US 2021/0407603 A1  Dec. 30, 2021

(51) Int. Cl.
*G11C 16/04* (2006.01)
*G11C 16/34* (2006.01)
*G11C 16/10* (2006.01)
*G11C 11/56* (2006.01)
*G11C 16/30* (2006.01)

(52) U.S. Cl.
CPC ...... *G11C 16/3459* (2013.01); *G11C 11/5628* (2013.01); *G11C 11/5671* (2013.01); *G11C 16/10* (2013.01); *G11C 16/30* (2013.01)

(58) Field of Classification Search
CPC ............ G11C 16/3459; G11C 11/5628; G11C 11/5671; G11C 16/10; G11C 16/30
See application file for complete search history.

(56) References Cited

U.S. PATENT DOCUMENTS

| | | | | |
|---|---|---|---|---|
| 6,907,497 B2 * | 6/2005 | Hosono | ............. | G11C 16/3454 365/185.22 |
| 7,558,122 B2 * | 7/2009 | Kim | ........................ | G11C 16/16 365/185.23 |
| 8,154,929 B2 * | 4/2012 | Kang | ................. | G11C 11/5628 365/185.22 |
| 10,915,394 B1 * | 2/2021 | Shappir | .................. | G11C 29/44 |

* cited by examiner

*Primary Examiner* — Pho M Luu
(74) *Attorney, Agent, or Firm* — Dickinson Wright PLLC; Steven C. Hurles

(57) ABSTRACT

An apparatus includes a memory controller configured to apply selected one or ones of the program verify voltage levels to a single tier of memory cells. A memory controller is configured to: program data into the plurality of memory cells; and perform a program verify operation across multiple voltage levels with a first voltage level of the program verify operation being applied to a single tier that represents all of the tiers in the memory group and a second voltage level of the program verify operation being applied to multiple tiers, wherein the first voltage level is less than the second voltage level. In embodiments, less than all of the tiers, e.g., two or four tiers, can be used in the program verify to represent all of the tires.

20 Claims, 13 Drawing Sheets

DYNAMIC TIER SELECTION FOR PROGRAM VERIFY IN NONVOLATILE MEMORY

BACKGROUND

The present technology relates to the operation of memory devices. Semiconductor memory devices have become more popular for use in various electronic devices. For example, non-volatile semiconductor memory is used in cellular telephones, digital cameras, personal digital assistants, mobile computing devices, non-mobile computing devices and other devices. The need for greater memory efficiency is needed while providing an adequate tradeoff between performance and reliability.

SUMMARY

Various embodiments are described herein for operating a nonvolatile memory, e.g., a NAND, a BICOS memory or the like. A memory can include a memory control circuitry and a plurality of memory cells arranged in tiers. The memory control circuitry is configured to: program data into the plurality of memory cells; and perform a program verify operation across multiple voltage levels with a first voltage level of the program verify operation being applied to a single tier that represents all of the tiers in the memory group and a second voltage level of the program verify operation being applied to multiple tiers, wherein the first voltage level is less than the second voltage level. In example embodiments, any of the states can be used to have the single tier program verify, which can be stored in circuitry in the memory controller. In example embodiments, at least one state uses fewer than all tiers to perform at least one state.

In an example embodiment, the memory control circuitry is configured to program verify at a third voltage level at a single tier, the third voltage level being greater than the second voltage level.

In an example embodiment, the single tier at third voltage is the same single tier that received the first voltage level.

In an example embodiment, the memory control circuitry applies the first voltage level, the second voltage level and the third voltage level at a control gate of the tiers.

In an example embodiment, the memory control circuitry is further configured to select a single tier that represents the program state of the other tiers.

In an example embodiment, the first voltage level is to verify an A state in the memory cells, and the third voltage level is to verify the G state of the memory cells In an example embodiment, the memory control circuitry is configured to apply a first instance of each voltage level in the program verify process to a single tier.

In an example embodiment, the memory control circuitry is configured to apply an A level, a B level, an F level and a G level to a single tier and to apply a C level, a D level and an E level to multiple tiers.

In an example embodiment, each application of the A level, the B level, the F level and the G level to the single tier are to a same tier.

In an example embodiment, the memory cells are multiple level memory cells storing greater than one bit.

A dynamic tier selection method for nonvolatile memory can include programing a multilevel cell memory array that includes multiple tiers and performing a program verify. The program verify can include applying a first level of a program verify signal to a single tier of the memory cells and applying an intermediate level of the program verify signal to a plurality of tiers of the memory cells.

In an example embodiment, performing a program verify includes applying a second level of the program verify signal to a single tier of the memory cells and applying a last level of the program verify signal to a single tier of the memory cells.

In an example embodiment, performing a program verify includes applying each instance of the first level of the program verify signal to the single tier of the memory cells and applying each instance of the last level of the program verify signal to the single tier of the memory cells.

In an example embodiment, the single tier of memory cells is the same tier of memory cells.

In an example embodiment, the intermediate levels are C level, a D level and an E level.

In an example embodiment, the memory cells are triple bit memory cells, wherein the first level is the A level, and wherein at least one of an C level, a D level, and an E level are the intermediate level.

In an example embodiment, the single tier is set in the memory control circuitry.

In an example embodiment, performing a program verify includes applying a first instance of a voltage level for each program verify state to the single tier.

BRIEF DESCRIPTION OF THE DRAWINGS

A more particular description is included below with reference to specific embodiments illustrated in the appended drawings. Understanding that these drawings depict only certain embodiments of the disclosure and are not, therefore, to be considered limiting of its scope, the disclosure is described and explained with additional specificity and detail through the use of the accompanying drawings, in which.

DETAILED DESCRIPTION

Systems and methods are described for controlling the program operations of nonvolatile memory to provide an intelligent tradeoff between the program verify and program time when programming data, e.g., multilevel data in the memory. The controller in the memory can direct a program verify operation on a single tier of memory cells when the programming level is such that the single tier will be representative of all tiers. The controller in the memory can direct a program verify operation on a multiple tiers of memory cells when the programming level is such that the single tier will not be representative of all tiers. The present inventors believe that while performing program verify, it is more favorable to select a single tier scan instead of multiple tiers scan for performance considerations. This may result in shorter program time (TPROG) and improved performance of the memory device. However, choosing an inappropriate tier scan can lead to over program (OP) issue for lower states and highest state with lower tail issue. Both of them result in smaller Vt window as well as poorer reliability. These issues are identified to be the program speed difference between inner and outer memory holes for some memory architectures, e.g., advanced BiCS.

Figure 1:
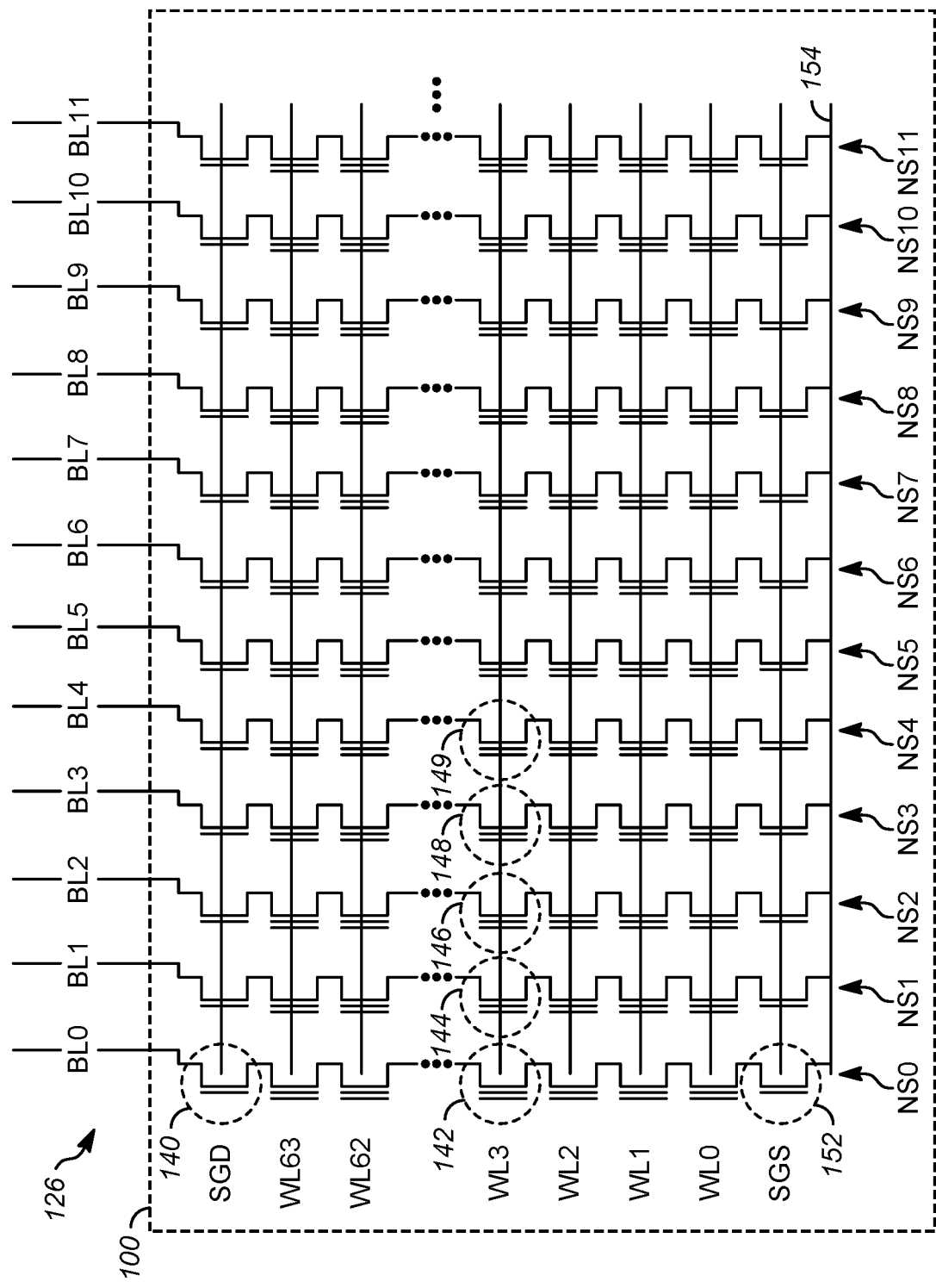
FIG. 1 illustrates an embodiment of an array of memory cells including bit and word lines according to an example embodiment.

FIG. 1 depicts an embodiment of memory arranged as NAND flash memory cells in a memory array 126. As used herein, the term "memory" denotes semiconductor memory. Types of semiconductor memory include volatile memory and non-volatile memory. Non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), spin-transfer torque magnetic random access memory (STT-RAM or STT-MRAM), resistive random access memory (e.g., ReRAM or RRAM) and phase change memory (e.g., PRAM or PCM). Non-volatile memory can be BiCS memory architecture. Non-volatile memory includes one or more memory cells. A "memory cell" is an electronic device or component capable of storing electronic information. In an embodiment, non-volatile memory utilizes floating-gate transistors or charge trap transistors as memory cells. The ability to adjust the threshold voltage of a floating-gate transistor or charge trap transistor allows the transistor to act as a non-volatile storage element or memory cell, such as a single-level cell (SLC). However, in some cases more than one data bit per memory cell (e.g., a multi-level cell) can be provided by programming and reading multiple threshold voltages or threshold voltage ranges, including a multi-level cell (MLC) (2 bits-per-cell), a triple level cell (TLC) (3 bits-per-cell), a quad-level cell (QLC) (4 bits-per-cell), and so forth.

The memory array 126 can include many blocks of memory. A "block of memory" is a set of memory cells. For example, a block of memory (e.g., an array of memory cells) includes memory cells arranged in word lines and bit lines. A "sub-block" of memory is a subset of a block of memory. For instance, a sub-block is a subset of memory cells corresponding to a subset of the word lines of a block of memory. In an embodiment, a sub-block includes fifty word lines in a block of memory, where the block of memory includes more than fifty word lines. A sub block can denote a physical sub-block, a logical sub-block, or both. A block of memory includes two or more sub-blocks. In an embodiment, memory is structured as two-dimensional (2D) NAND. In another embodiment, memory is structured as three-dimensional (3D) NAND. In an embodiment, one or more of the components described herein (e.g., memory die, memory, block, sub-block, memory cells, circuits, controllers, and/or non-volatile storage systems) are implemented with one or more elements (e.g., transistors, resistors, capacitors, inductors, and/or conductors) in integrated circuitry.

An illustrative block of memory (or block) 100, as shown in FIG. 1, includes a number of NAND strings NS0 to NS11 and respective bit lines (e.g., BL0 to BL11, which are shared among the blocks). Each NAND string is connected at one end to a drain select gate (SGD), and the control gates of the drain select gates are connected via a common SGD line. Each NAND string is connected at its other end to a source select gate (SGS) which, in turn, is connected to a common source line 154. For example, NS0 includes a source side select gate transistor 152 and a drain side select gate transistor 140. Example storage elements 142, 144, 146, 148, and 149 are in NS0 to NS4, respectively, and are connected to a word line WL3. For example, WL3 could be a selected word line which is selected for programming and the example storage elements can be selected storage elements which are selected for programming. Other storage elements connected to WL3 can also be selected storage elements. Sixty-four word lines, for example, WL0-WL63, extend between the source-side select gates and the drain-side select gates.

Other types of non-volatile memory in addition to NAND flash memory can also be used. For example, another type of memory cell useful in flash EEPROM systems utilizes a nonconductive dielectric material in place of a conductive floating gate to store charge in a nonvolatile manner. In an embodiment, triple layer dielectric formed of silicon oxide, silicon nitride, and silicon oxide (ONO) is sandwiched between a conductive control gate and a surface of a semi-conductive substrate above the memory cell channel. The cell is programmed by injecting electrons from the cell channel into the nitride, where they are trapped and stored in a limited region. This stored charge then changes the voltage level of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor. Another type of memory uses a metallic (conductive) charge storage element in a NAND architecture.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is obtained by separately reading binary states of the spatially separated charge storage regions within the dielectric. Other types of non-volatile memory are also known. In an alternative embodiment, resistance levels rather than threshold voltage levels can be stored and sensed.

Figure 2:
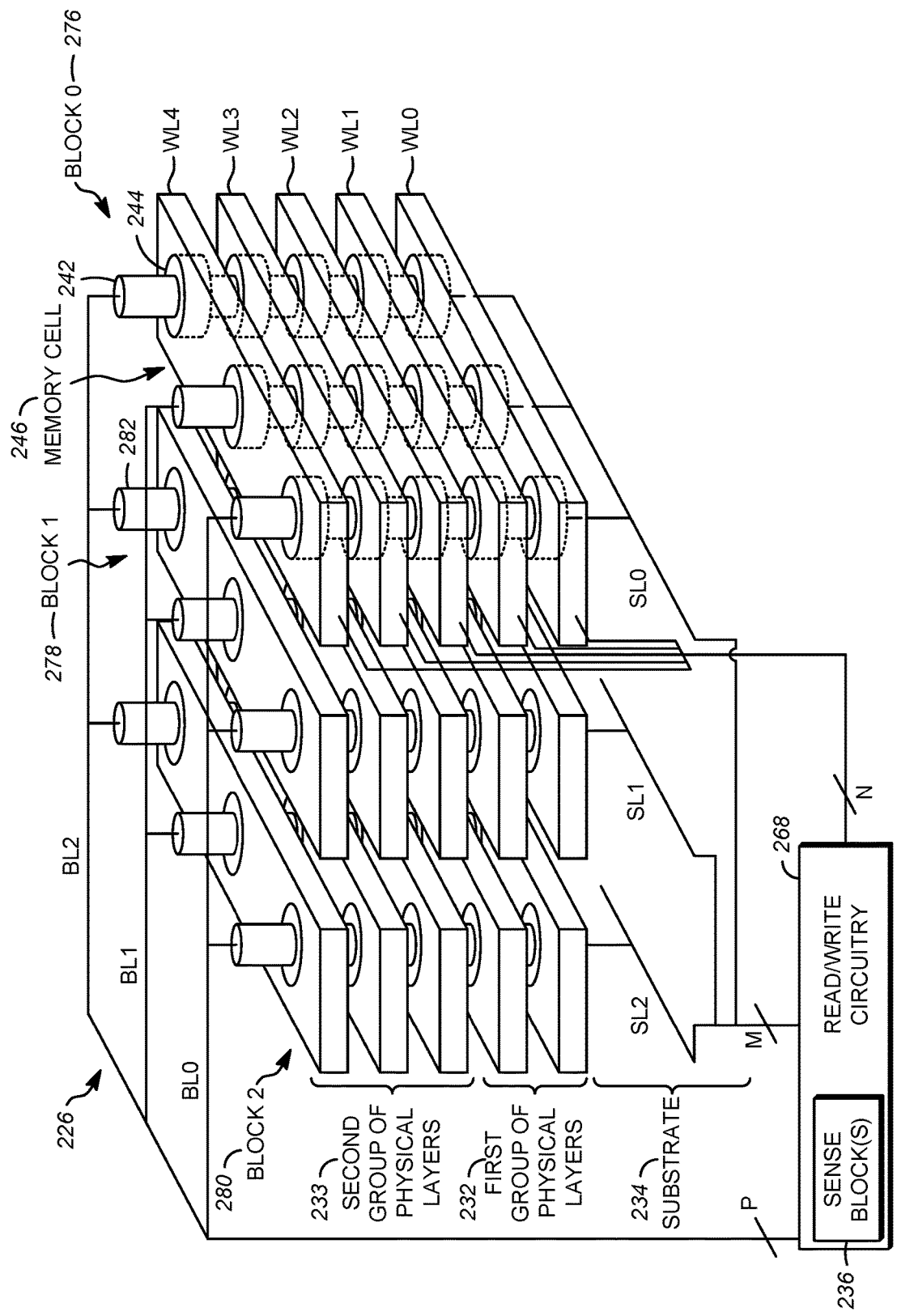
FIG. 2 illustrates a diagram of a three-dimensional (3D) memory in a NAND configuration according to an example embodiment.

FIG. 2 illustrates an embodiment of 3D memory 226 in a NAND flash configuration. The 3D memory 226 includes multiple physical layers that are monolithically formed above a substrate 234, such as a silicon substrate. Storage elements (e.g., memory cells), such as a representative memory cell 246, are arranged in arrays in the physical layers.

The representative memory cell 246 includes a charge trap structure 244 between a word line/control gate WL4 and a conductive channel 242. Charge can be injected into or drained from the charge trap structure 244 via biasing of the conductive channel 242 relative to the word line WL4. For example, the charge trap structure 244 can include silicon nitride and can be separated from the word line WL4 and the conductive channel 242 by a gate dielectric, such as a silicon oxide. An amount of charge in the charge trap structure 244 affects an amount of current through the conductive channel 242 during a read operation of the memory cell 246 and indicates one or more bit values that are stored in the memory cell 246.

The 3D memory 226 includes multiple erase blocks, including a first block (block 0) 276, a second block (block 1) 278, and a third block (block 2) 280. Each block 276, 278, 280 includes a "vertical slice" of the physical layers that includes a stack of word lines, illustrated as a first word line WL0, a second word line WL1, a third word line WL2, a fourth word line WL3, and a fifth word line WL4. Multiple conductive channels (having a substantially vertical orientation, as shown in FIG. 2) extend through the stack of word lines. Each conductive channel is coupled to a storage element in each word line WL0-WL4, forming a NAND string of storage elements. FIG. 2 illustrates three blocks 276, 278, 280, five word lines WL0-WL4 in each block 276, 278, 280, and three conductive channels in each block 276, 278, 280 for clarity of illustration. However, the 3D memory 226 can have more than three blocks, more than five word lines per block, and more than three conductive channels per block.

Read/write circuitry 268 (which can be part of a controller) is coupled to the conductive channels via multiple conductive lines, illustrated as a first bit line BL0, a second bit line BL1, and a third bit line BL2 at a first end of the conductive channels (e.g., an end most remote from the substrate 234) and a first source line SL0, a second source line SL1, and a third source line SL2 at a second end of the conductive channels (e.g., an end nearer to or within the substrate 234). The read/write circuitry 268 is illustrated as coupled to the bit lines BL0-BL2 via "P" control lines, coupled to the source lines SL0-SL2 via "M" control lines, and coupled to the word lines WL0-WL4 via "N" control lines. Each of P, M, and N can have a positive integer value based on the specific configuration of the 3D memory 226. In the example shown in FIG. 2, P=3, M=3, and N=5.

In a particular embodiment, each of the bit lines BL0-BL2 and each of the source lines SL0-SL2 can be coupled to the same end (e.g., the first end or the second end) of different conductive channels. For example, a particular bit line BL0-BL2 can be coupled to a first end of a conductive channel 282 and a particular source line can be coupled to a first end of the conductive channel 242. A second end of the conductive channel 282 can be coupled (e.g., electrically coupled) to a second end of the conductive channel 242. Accordingly, the conductive channel 282 and the conductive channel 242 can be coupled in series and can be coupled to the particular bit line BL0-BL2 and the particular source line SL0-SL2, each of which is coupled to a particular NAND string.

Although each of the conductive channels, such as the conductive channels 242, 282, is illustrated as a single conductive channel, each of the conductive channels can include multiple conductive channels that are in a stack configuration. The multiple conductive channels in a stacked configuration can be coupled by one or more connectors. Additionally, an etch stop layer (not illustrated in FIG. 2) having a conductive connector coupled to physically proximate portions of a conductive channel can be included in the multiple conductive channels, such as between the first group of physical layers 232 and the second group of physical layers 233. Additionally, or alternatively, one or more sub-block gate transistors (not illustrated in FIG. 2) can be coupled between the first group of physical layers 232 and the second group of physical layers 233.

In an embodiment, the first group of physical layers 232 is an example of a first sub-block and the second group of physical layers 233 is an example of a second sub-block. For example, each sub-block (e.g., "word line-based" sub-blocks) can include memory cells corresponding to a subset of word lines WL0-WL4. In an alternative embodiment, each sub-block (e.g., "string-based" sub-blocks) can include memory cells corresponding to a subset of strings (e.g., NAND strings), and can have, for example, common source lines SL0-SL2, but not common bit lines BL0-BL2 or vice versa.

The read/write circuitry 268 facilitates and/or effectuates read and write operations performed on the 3D memory 226. For example, data can be stored to storage elements coupled to a word line WL0-WL4 and the read/write circuitry 268 can read bit values from the storage elements (e.g., memory cells) using one or more sense blocks 236. As another example, the read/write circuitry 268 can apply selection signals to control lines coupled to the word lines WL0-WL4, the bit lines BL0-BL2, and the source lines SL0-SL2 to cause a programming voltage (e.g., a voltage pulse or series of voltage pulses) to be applied across selected storage element(s) of the selected word line (e.g., the fourth word line WL4). The read/write circuitry 226 can also perform verify operations as part of the programming operation.

The read/write circuitry 268 includes one or more sense blocks 236. The sense blocks 236 are utilized to read or sense one or more values stored in a memory cell. In one approach, one sense block 236 is provided for a group of NAND strings, each of which is coupled to a particular bit line BL0-BL2. For example, a sense block 236 is associated with BL0. Another sense block 236 is associated with BL1, and yet another sense block 236 is associated with BL2. Each sense block 236 can include a memory controller (not illustrated in FIG. 2). Each sense block 236 also includes a sense module for each NAND string. Alternatively, a sense block 236 can be coupled to an interval of bit lines, such as even or odd numbered bit lines.

During a read operation, a controller can receive a request from a host device, such as a computer, smartphone, or laptop computer. The controller can cause the read/write circuitry 268 to read bits from particular storage elements of the 3D memory 226 by applying appropriate signals to the control lines to cause storage elements of a selected word line to be sensed. Accordingly, the 3D memory 226 having multiple conductive channels in a stacked configuration can be configured to read from and write data to one or more storage elements.

One or more sub-blocks of memory cells 246 in an array of memory cells 246 can be coupled by a channel (e.g., a physical communication channel). In an embodiment, the channel comprises a bit line BL0-BL2 and/or a source line SL0-SL2.

Figure 3:
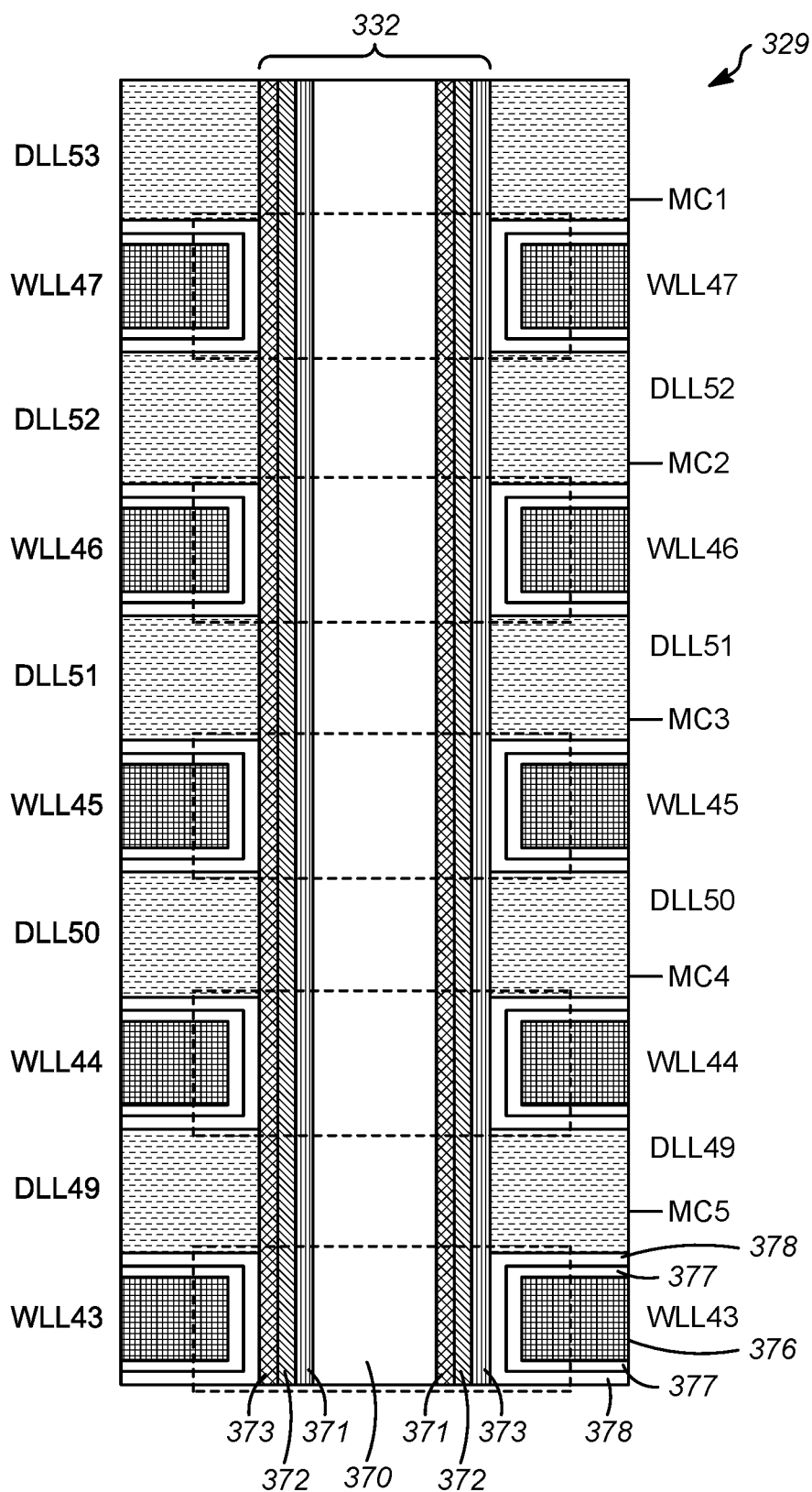
FIG. 3 illustrates a schematic block diagram illustrating an embodiment of a 3D vertical memory structure according to an example embodiment.

FIG. 3 illustrates one embodiment of a cross-sectional view of a 3D, vertical memory structure or string 329. In one embodiment, the vertical column 332 is round and includes four layers; however, in other embodiments more or less than four layers can be included, and other shapes can be used (e.g., a "U" shape instead of an "I" shape or the like). In one embodiment, a vertical column 332 includes an inner core layer 370 that is made of a dielectric, such as SiO2. Other materials can also be used. Surrounding the inner core or inner core layer 370 is a polysilicon channel 371. Materials other than polysilicon can also be used. Note that it is the channel 371 that connects to the bit line. Surrounding the channel 371 is a tunneling dielectric 372. In one embodiment, the tunneling dielectric 372 has an ONO structure. Surrounding the tunneling dielectric 372 is a shared charge-trapping layer 373, such as (for example) Silicon Nitride. Other materials and structures can also be used. The technology described herein is not limited to any particular material or structure.

FIG. 3 depicts dielectric layers DLL49, DLL50, DLL51, DLL52, and DLL53, as well as word line layers WLL43, WLL44, WLL45, WLL46, and WLL47. Each of the word line layers includes a word line region 376 surrounded by an aluminum oxide layer 377, which is surrounded by a blocking oxide (SiO2) layer 378. The physical interaction of the word line layers with the vertical column 332 forms the memory cells. Thus, a memory cell, in one embodiment, comprises the channel 371, tunneling dielectric 372, charge-trapping layer 373 (e.g., shared with other memory cells), blocking oxide layer 378, aluminum oxide layer 377, and the word line region 376. In some embodiments, the blocking oxide layer 378 and aluminum oxide layer 377 can be replaced by a single layer of material with insulating properties or by more than two layers of different material with insulating properties. Furthermore, the materials used are not limited to silicon dioxide (SiO2) or aluminum oxide. For example, word line layer WLL47 and a portion of vertical column 332 comprise a memory cell MC1. Word line layer WLL46 and a portion of vertical column 332 comprise a memory cell MC2. Word line layer WLL45 and a portion of vertical column 332 comprise a memory cell MC3. Word line layer WLL44 and a portion of vertical column 332 comprise a memory cell MC4. Word line layer WLL43 and a portion of vertical column 332 comprise a memory cell MC5. In other architectures, a memory cell can have a different structure, however, the memory cell would still be the storage unit.

When a memory cell is programmed, electrons are stored in a portion of the charge-trapping layer 373 that is associated with the memory cell. These electrons are drawn into the charge-trapping layer 373 from the channel 371, through the tunneling dielectric 372, in response to an appropriate voltage on the word line region 376. The threshold voltage (Vt) of a memory cell is increased in proportion to the amount of stored charge. In one embodiment, the programming is achieved through Fowler-Nordheim tunneling of the electrons into the charge-trapping layer. During an erase operation, the electrons return to the channel or holes are injected into the charge-trapping layer to recombine with electrons. In one embodiment, erasing is achieved using hole injection into the charge-trapping layer via a physical mechanism such as gate induced drain leakage (GIDL).

Storage cells in the same location or position in different memory structures 329 (e.g., different memory strings 329) on different bit lines, in certain embodiments, can be on the same word line. Each word line can store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D memory structure 329 comprises an "I" shaped memory structure 329. In other embodiments, a vertical, 3D memory structure 329 can comprise a "U" shaped structure or can have another vertical and/or stacked architecture. In certain embodiments, four sets of strings 329 (e.g., four sets of 48 word lines, or another predefined number of word lines) can form an erase block, while in other embodiments, fewer or more than four sets of strings 329 can form an erase block. As can be appreciated, any suitable number of storage cells can be part of a single string 329. In one embodiment, a single string 329 includes 48 storage cells.

Figure 4:
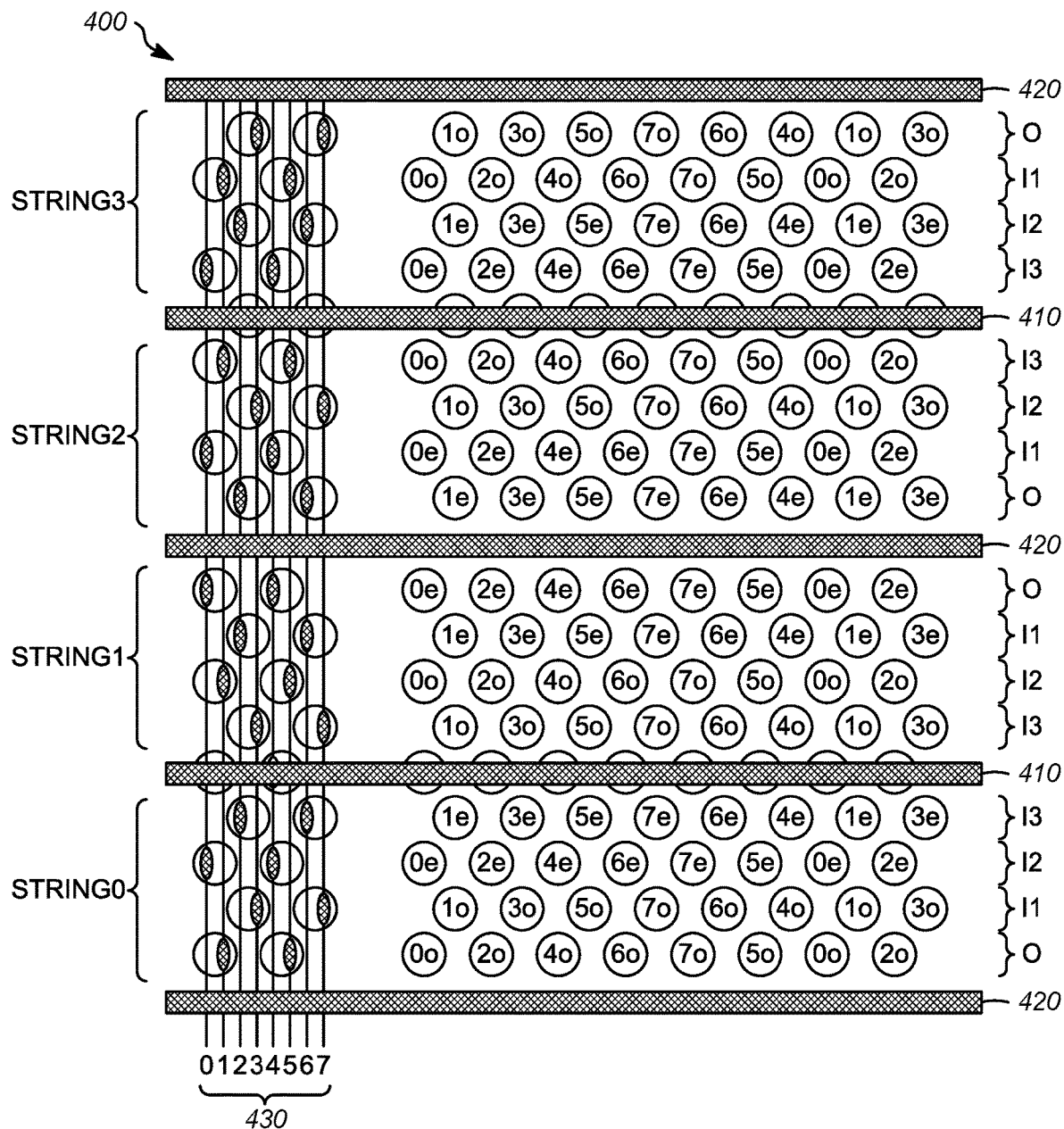
FIG. 4 illustrates a diagram showing a top view of a 3D memory block according to an example embodiment.

FIG. 4 is a diagram illustrating a top view of a 3D memory block 400, according to one embodiment. As illustrated, the 3D memory block 400 can comprise a series of memory holes or cells (represented by circles labeled "0o" to "7o" and "0e" to "7e" in FIG. 4). Each of these memory holes can be organized into strings (labeled as "String0" to "String3" in FIG. 4) and/or further organized into IO groups (labeled as "O," "I1," "I2," and "I3" in FIG. 4). Each IO group is located between two different types of etching features formed in the 3D memory block 400, a shallow etching feature 410 (e.g., called SHE), and a deep etching feature 420 (e.g., called ST). The IO groups adjacent to a deep etching feature 420 are labeled outer IO groups (O); the IO groups adjacent to a shallow etching feature 410 are labeled Inner3 IO groups (I3); the IO groups adjacent to the Outer IO groups are labeled Inner1 IO groups (I1); and the IO groups adjacent to the Inner3 IO groups (I3) are labeled Inner2 IO groups (I2). It should be noted that the procedures and methods disclosed herein can be implemented in connection with a wide variety of types of memory, such as NAND or NOR memory, 2D memory, 3D memory, or memory employing a charge-based or resistive-based storage technology. In one example, the illustrated memory block 400 can comprise 16K memory cells, which can be further segregated into smaller groups of memory cells comprising 1K memory cells each. These smaller groups can be arranged in tiers. The tiers can include the memory cells associated with the holes designated by the same designated circles in FIG. 4. The memory cells labeled as 2o are part of a same tier. The memory cells labeled 3e are part another tier. The memory cells labeled as 2e are part of a same tier. The memory cells labeled 3o are part another tier. As explained herein the controller can select a single tier for a program verify operation when the program verify level is unlikely to find an overprogrammed state or when the single tier is representative of the other tiers. At least one intermediate level for program verify is a multiple tier verify operation.

Some manufacturing processes for 3D memory can include film deposition processes that tend to dominate over etching processes performed during manufacturing. For these types of manufacturing processes, the outer memory holes in the Outer IO groups (O) will generally program slower than the inner memory hole (I3). However, other manufacturing processes for 3D memory can include etching processes that tend to dominate over film deposition processes during manufacturing. For these types of manufacturing processes, the inner memory hole (I3) will generally program slower than the outer memory holes (O). It should be noted, however, that the physical position of an IO group of memory cells within the 3D memory structure is not always dispositive of its relative programming speed due to this variation introduced during the manufacturing process or as a result of wear induced by usage of the device. Moreover, cycling degradation can also cause the relative programming speed of different memory cells, or groups of memory cells, to shift over time.

Continuing with FIG. 4, each of the memory holes (0o-7o and 0e-7e) can be connected to bit lines 430 (labeled as bit lines 0-7 in FIG. 4). The bit lines 430 extend above the memory holes and are connected to select memory holes via connection points (illustrated as small, solid ovals in FIG. 4) indicating where a bit line 430 connects to a memory hole. For ease of illustration, only eight bit lines 430 (0 to 7) are shown in FIG. 4. However, it will be understood that other bit lines (not shown) also extend above the other memory holes in FIG. 4.

Figure 5:
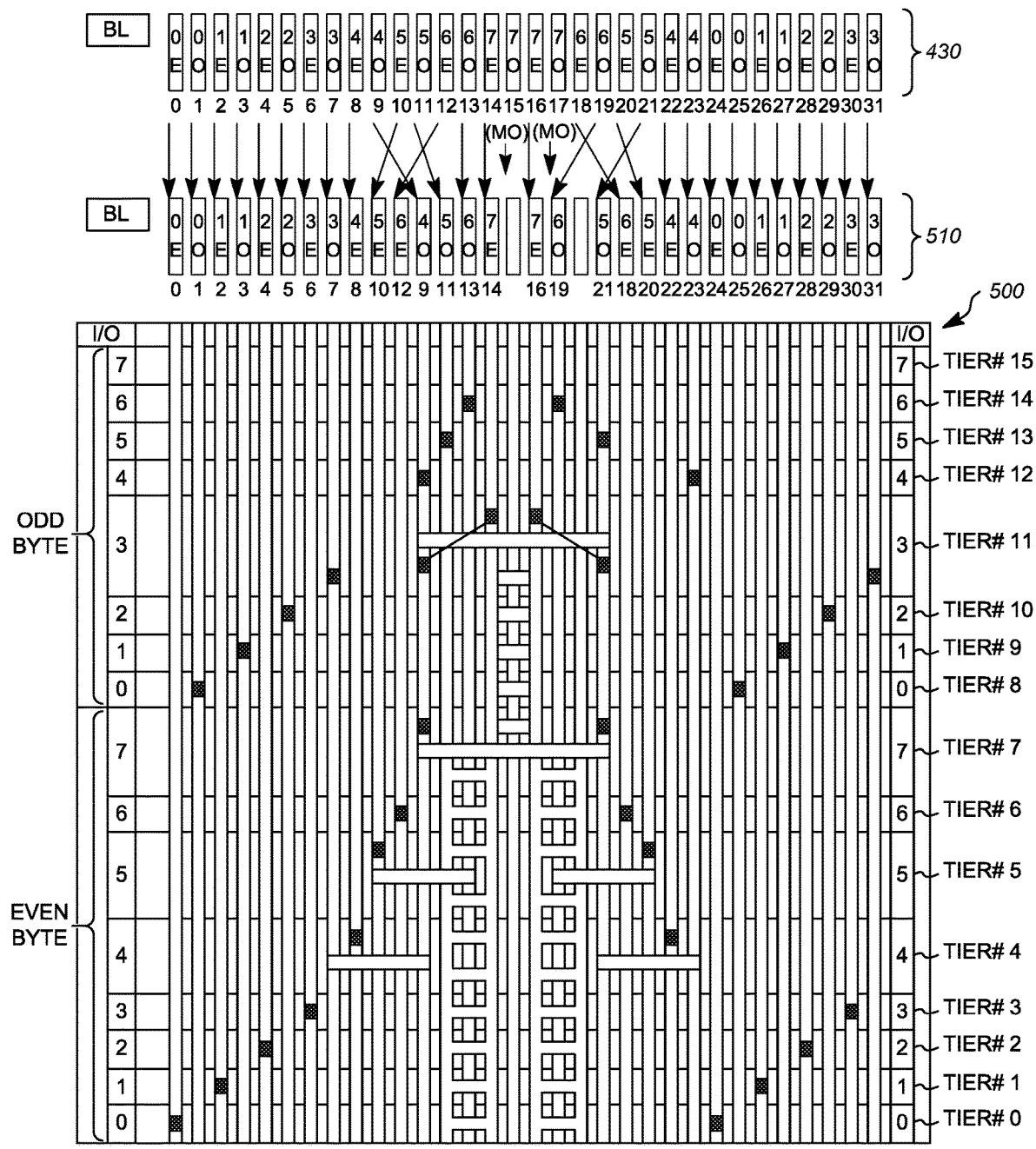
FIG. 5 illustrates an array of sense amplifier groups according to an exemplary embodiment for the 3D memory block of FIG. 4.

FIG. 5 illustrates an array of sense amplifier groups 500 for the 3D memory structure 400 of FIG. 4, according to one example. The bit lines 430 shown in FIG. 4 extend to the array of sense amplifier groups 500, as can be seen in FIG. 5. In this manner, certain memory holes of the 3D memory structure 400 can be electrically coupled to one of the bit lines 430, and each bit line can then be electrically coupled to a bit line interface 510. In an embodiment, the bit line interface 510 can additionally use scrambling, as illustrated by the angled/non-vertical lines shown in FIG. 5 between the bit lines 430 and the bit line interface 510. Thereafter, each bit line 430 can be electrically coupled to a sense amplifier group (labeled as Tier #0 to Tier #15 in FIG. 5). As illustrated in FIG. 5, each sense amplifier group extends horizontally across the page. Accordingly, each "tier" comprises a group of memory holes in electrical communication with a particular sense amplifier group via a bit line 430. A tier can also be referred to as a "subgroup of memory cells," or just a "subgroup." A "subgroup" of memory cells can be any subset of memory cells formed from a larger group of memory cells. In this application, a subgroup of memory cells can be referred to as a tier, a tier group, an IO group, a division, and the like.

Figure 6:
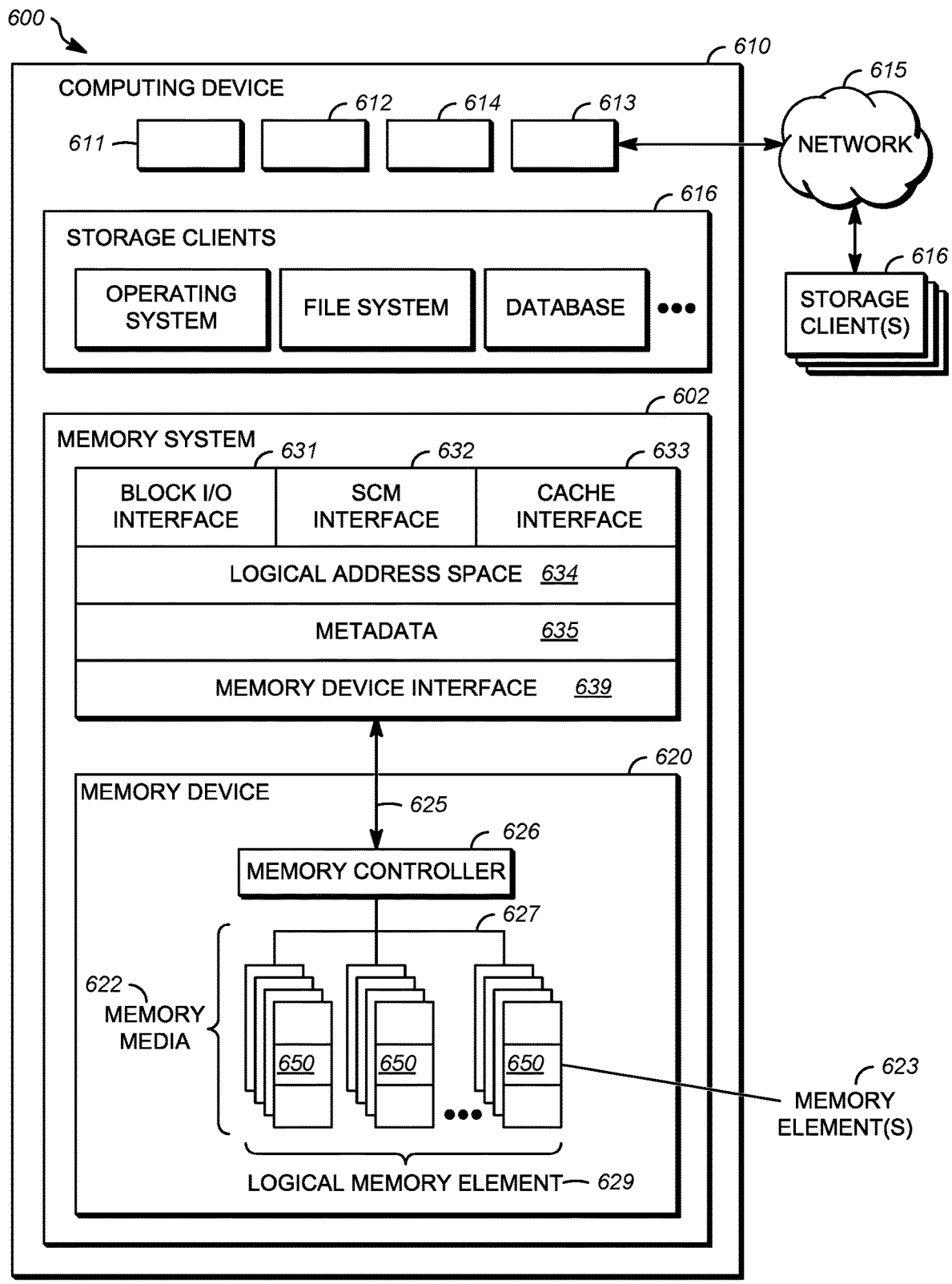
FIG. 6 illustrates a schematic block diagram illustrating an embodiment of a memory system according to an example embodiment.

FIG. 6 is a schematic block diagram illustrating an embodiment of a system 600 and device 610 for memory cell subgroup identification and selection. The computing device 610 comprises one or more identification circuits or tier selection circuits 650 for memory media 622 of a non-volatile and/or volatile memory device 620. As used herein, an "tier circuit" refers to a circuit utilized to identify a particular tier of memory cells (e.g., a 2o tier memory cells) in relation to at least one other subgroup or tier of memory cells and select the identified tier of memory cells for use in at least one programming operation, e.g., program verify. The tier selection circuits can operate to select a single tier for some program verify levels and multiple tiers for other program verify levels in a same verify operation. At least one verify is a single tier verify, e.g., the A or first program verify level. The first program verify level can be the lowest voltage. In an example embodiment, the last program verify level is also a single tier verify operation. In an example embodiment, at least one intermediate program verify is performed on multiple tiers.

A tier selection circuit 650 can be part of a non-volatile and/or volatile memory element 623 (e.g., disposed on a same integrated circuit device as a non-volatile memory media 622). In some embodiments, a memory device 620 can at least partially operate on and/or in communication with a nonvolatile and/or volatile memory system 602 of a computing device 610, which can comprise a processor 611, volatile memory 612, and a communication interface 613. The processor 611 can comprise one or more central processing units, one or more general-purpose processors, one or more application-specific processors, one or more virtual processors (e.g., the computing device 610 can be a virtual machine operating within a host), one or more processor cores, or the like. The communication interface 613 can comprise one or more network interfaces configured to communicatively couple the computing device 610 and/or memory controller 626 to a communication network 615, such as an Internet Protocol (IP) network, a Storage Area Network (SAN), wireless network, wired network, or the like. While the present disclosure discusses the tier selection circuit 650, it is within the scope of the present disclosure for the memory controller 626 to select the tier for the single tier program verify and select the multiple tiers for the multiple tier program verification.

In an embodiment, the most representative tier of memory cells can be selected for program verify operations to represent all of the tiers when making sure that the memory cells are correctly programmed, e.g., no over programming. In an example embodiment, there can be sixteen tiers and a single tier can be selected for the first program verify level, e.g., only one of 2o or 3e (FIG. 4.) In other embodiments, the most reliable tier for each string can be selected for certain the single verify operations in order to balance performance with reliability (time versus over programming issues). Depending on the manufacturing process used, certain tiers may be known to be representative of the other tiers and, in some embodiments, can be the default setting stored in the memory, e.g., in the memory controller 626. However, due to process variations, word line dependencies, string dependencies, degradation, etc., sometimes other tiers may be the representative tier, as discussed herein.

A tier selection circuit 650 or tier selection operation of the memory controller 626, in certain embodiments, can determine if a number of memory cells for a single tier for certain program verify operations, exceed an A state program verify level (and/or another predefined verify level) during an A-verify program operation, which is performed on a single tier, e.g., 2o. As used herein, a verify or verification level can refer to any level associated with a particular state that may be reached during programming or erasing of a memory cell.

The memory device 620, in various embodiments, can be disposed in one or more different locations relative to the computing device 610. In one embodiment, the memory device 620 comprises one or more non-volatile and/or volatile memory elements 623, such as semiconductor chips or packages or other integrated circuit devices disposed on one or more printed circuit boards, storage housings, and/or other mechanical and/or electrical support structures. For example, the memory device 620 can comprise one or more direct inline memory module (DIMM) cards, one or more expansion cards and/or daughter cards, a memory card, a universal serial bus (USB) drive, a solid-state-drive (SSD) or other hard drive device, and/or can have another memory and/or storage form factor. The memory device 620 can be integrated with and/or mounted on a motherboard of the computing device 610, installed in a port and/or slot of the computing device 610, installed on a different computing device 610 and/or a dedicated storage appliance on the network 615, in communication with the computing device 610 over an external bus (e.g., an external hard drive), or the like.

The memory device 620, in one embodiment, can be disposed on a memory bus of a processor 611 (e.g., on the same memory bus as the volatile memory 612, on a different memory bus from the volatile memory 612, in place of the volatile memory 612, or the like). In a further embodiment, the memory device 620 can be disposed on a peripheral bus of the computing device 610, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the memory device 620 can be disposed on a data network 615, such as an Ethernet network, an Infiniband network, SCSI RDMA over a network 615, a storage area network (SAN), a local area network (LAN), a wide area network (WAN) such as the Internet, another wired and/or wireless network 615, or the like.

The computing device 610 can further comprise a non-transitory, computer readable storage medium 614. The computer readable storage medium 614 can comprise executable instructions configured to cause the computing device 610 (e.g., processor 611) to perform steps of one or more of the methods disclosed herein. In one embodiment, a subgroup selection circuit 650 can comprise hardware of a non-volatile and/or volatile memory element 623, computer executable program code of a device driver, firmware of a memory controller 626 and/or a memory media controller for a memory element 623, another electrical component, or the like. In one embodiment, a subgroup selection circuit 650 is integrated on a memory element 623 (e.g., an on-die subgroup selection circuit 650 and/or other integrated hardware).

According to various embodiments, a memory controller 626 can manage one or more memory devices 620 and/or memory elements 623, one or more of which can comprise an on-die subgroup selection circuit 650. The memory device(s) 620 can comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 620). Memory units and/or regions can include, but are not limited to: pages, memory divisions, blocks, sectors, collections or sets of physical storage locations (e.g., logical pages, logical blocks), or the like.

A device driver and/or the memory controller 626, in certain embodiments, can present a logical address space 634 to the storage clients 616. As used herein, a logical address space 634 refers to a logical representation of memory resources. The logical address space 634 can comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the memory device 620 can maintain metadata 635, such as a logical to physical address mapping structure to map logical addresses of the logical address space 634 to media storage locations on the memory device(s) 620. A device driver can be configured to provide storage services to one or more storage clients 616. The storage clients 616 can include local storage clients 616 operating on the computing device 610 and/or remote storage clients 616 accessible via the network 615 and/or network interface 613. The storage clients 616 can include, but are not limited to: operating systems, file systems, database applications, server applications, kernel-level processes, user-level processes, applications, and the like.

A device driver can be communicatively coupled to one or more memory devices 620. The one or more memory devices 620 can include different types of memory devices including, but not limited to: solid-state storage devices, semiconductor storage devices, SAN storage resources, volatile memory devices, non-volatile memory devices, or the like. The one or more memory devices 620 can comprise one or more respective memory media controllers 626 and memory media 622. A device driver can provide access to the one or more memory devices 620 via a traditional block I/O interface 631. Additionally, a device driver can provide access to enhanced functionality through the SCM interface 632. The metadata 635 can be used to manage and/or track data operations performed through any of the Block I/O interface 631, SCM interface 632, cache interface 633, or other related interfaces.

The cache interface 633 can expose cache-specific features accessible via a device driver for the memory device 620. Also, in some embodiments, the SCM interface 632 presented to the storage clients 616 provides access to data transformations implemented by the one or more memory devices 620 and/or the one or more memory media controllers 626.

A device driver can present a logical address space 634 to the storage clients 616 through one or more interfaces. As discussed above, the logical address space 634 can comprise a plurality of logical addresses, each corresponding to respective media locations on one or more memory devices 620. A device driver can maintain metadata 635 comprising any-to-any mappings between logical addresses and media locations, or the like.

A device driver can further comprise and/or be in communication with a memory device interface 639 configured to transfer data, commands, and/or queries to the one or more memory devices 620 over a bus 625, which can include, but is not limited to: a memory bus of a processor 611, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 615, Infiniband, SCSI RDMA, or the like. The memory device interface 639 can communicate with the one or more memory devices 620 using input-output control (IO-CTL) command(s), IO-CTL command extension(s), remote direct memory access, or the like.

The communication interface 613 can comprise one or more network interfaces configured to communicatively couple the computing device 610 and/or the memory controller 626 to a network 615 and/or to one or more remote, network-accessible storage clients 616. The storage clients 616 can include local storage clients 616 operating on the computing device 610 and/or remote storage clients 616 accessible via the network 615 and/or the network interface 613. The memory controller 626 is part of and/or in communication with one or more memory devices 620.

Although FIG. 6 depicts a single memory device 620, the disclosure is not limited in this regard and could be adapted to incorporate any number of memory devices 620, a combination of one or more volatile memory devices 620 and one or more non-volatile memory devices 620, or the like.

The memory device 620 can comprise one or more elements 623 of memory media 622. In one embodiment, an element 623 of memory media 622 comprises a volatile memory medium 622, such as random-access memory (RAM), dynamic RAM (DRAM), synchronous DRAM (SDRAM), double data rate (DDR) SDRAM, static RAM (SRAM), thyristor RAM (T-RAM), zero-capacitor RAM (Z-RAM), or the like. In certain embodiments, an element 623 of memory media 622 comprises a non-volatile memory medium 622, such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS) memory, programmable metallization cell (PMC) memory, conductive-bridging RAM (CBRAM), magneto-resistive RAM (MRAM), magnetic storage media (e.g., hard disk, tape), optical storage media, or the like. Thus, the memory device 620 may rely, for example, on stored voltage levels or stored resistance levels. The one or more elements 623 of memory media 622, in certain embodiments, comprise storage class memory (SCM).

While legacy technologies such as NAND flash can be block and/or page addressable, storage class memory, in one embodiment, is byte addressable. In further embodiments, storage class memory can be faster and/or have a longer life (e.g., endurance) than NAND flash; can have a lower cost, use less power, and/or have a higher storage density than DRAM; or offer one or more other benefits or improvements when compared to other technologies. For example, storage class memory can comprise one or more non-volatile memory elements 623 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 622 is referred to herein as "memory media," in various embodiments, the non-volatile memory media 622 can more generally comprise one or more non-volatile recording media capable of recording data, which can be referred to as a non-volatile memory medium, a non-volatile storage medium, or the like. Further, the nonvolatile memory device 620, in various embodiments, can comprise a non-volatile recording device, a non-volatile memory device, a non-volatile storage device, or the like. Similarly, a nonvolatile memory element 623, in various embodiments, can comprise a non-volatile recording element, a non-volatile memory element, a non-volatile storage element, or the like.

The non-volatile memory media 622 can comprise one or more non-volatile memory elements 623, which can include, but are not limited to: chips, packages, planes, die, or the like. A non-volatile memory controller 626 can be configured to manage data operations on the nonvolatile memory media 622, and can comprise one or more processors, programmable processors (e.g., FPGAs), ASICs, microcontrollers, or the like. In some embodiments, the nonvolatile memory controller 626 is configured to store data on and/or read data from the nonvolatile memory media 622, to transfer data to/from the non-volatile memory device 620, and so on.

The non-volatile memory controller 626 can be communicatively coupled to the non-volatile memory media 622 by way of a bus 627. The bus 627 can comprise an I/O bus for communicating data to/from the non-volatile memory elements 623. The bus 627 can further comprise a control bus for communicating addressing, and other command and control information to the non-volatile memory elements 623. In some embodiments, the bus 627 can communicatively couple the non-volatile memory elements 623 to the non-volatile memory controller 626 in parallel. This parallel access can allow the non-volatile memory elements 623 to be managed as a group, forming a logical memory element 629. The logical memory element can be partitioned into respective logical memory units (e.g., logical pages) and/or logical memory divisions (e.g., logical blocks). The logical memory units can be formed by logically combining physical memory units of each of the non-volatile memory elements.

The non-volatile memory controller 626 can comprise and/or be in communication with a device driver executing on the computing device 610. A device driver can provide storage services to the storage clients 616 via one or more interfaces 631, 632, and/or 633. In some embodiments, a device driver provides a block-device I/O interface 631 through which storage clients 616 perform block-level I/O operations. Alternatively, or in addition, a device driver can provide a storage class memory (SCM) interface 632, which can provide other storage services to the storage clients 616. In some embodiments, the SCM interface 632 can comprise extensions to the block device interface 631 (e.g., storage clients 616 can access the SCM interface 632 through extensions or additions to the block device interface 631). Alternatively, or in addition, the SCM interface 632 can be provided as a separate API, service, and/or library. A device driver can be further configured to provide a cache interface 633 for caching data using the non-volatile memory system 602. A device driver can further comprise a non-volatile memory device interface 639 that is configured to transfer data, commands, and/or queries to the non-volatile memory controller 626 over a bus 625, as described above.

Figure 7:
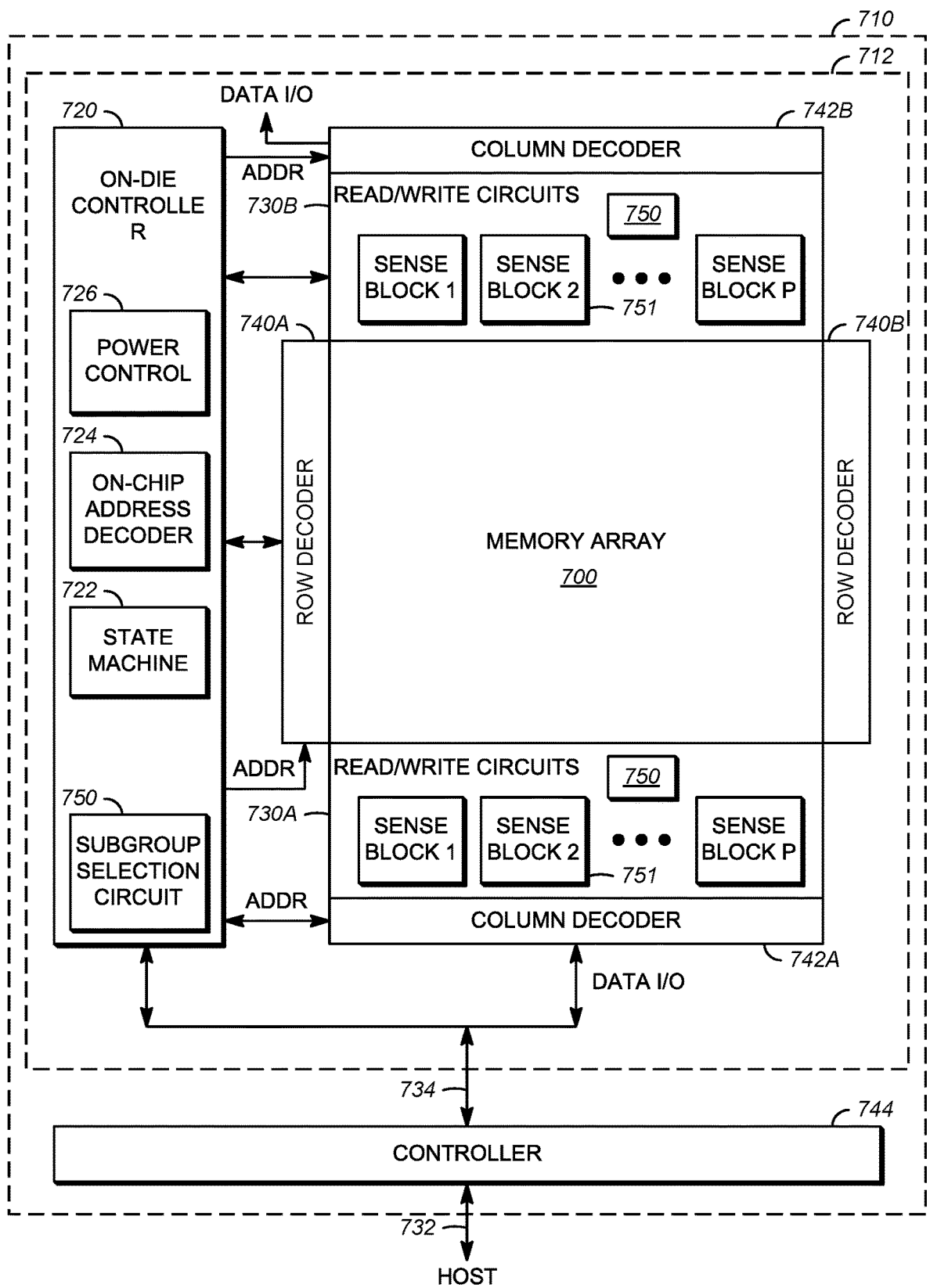
FIG. 7 illustrates a schematic block diagram of nonvolatile storage device for memory cell subgroup identification and selection.

FIG. 7 is a schematic block diagram illustrating an embodiment of a non-volatile storage device 710 for selection of certain tiers for certain program verify levels. The non-volatile storage device 710 can include one or more memory die or chips 712A "memory die" comprises a block of semiconducting material on which a memory circuit is fabricated and, as used herein, also includes the memory circuit disposed thereon. The nonvolatile storage device 710 can be substantially similar to the computing device 610 described with reference to FIG. 6.

The memory die 712, in some embodiments, includes an array 700 (e.g., two-dimensional or three dimensional) of memory cells, an on-die controller 720, and read/write circuits 730A/730B. In one embodiment, access to the memory array 700 by the various peripheral circuits is implemented in a symmetric fashion, on opposite sides of the memory array 700, so that the densities of access lines and circuitry on each side are reduced by half. The read/write circuits 730A/730B, in a further embodiment, include multiple sense blocks 751 which allow a page of memory cells to be read or programmed in parallel.

The memory array 700, in various embodiments, is addressable by word lines via row decoder circuits 740A/

740B and by bit lines via column decoder circuits 742A/742B. In some embodiments, a controller 744 is included in the same memory device 710 (e.g., a removable storage card or package) as the one or more memory die 712. Commands and data are transferred between the host and controller 744 via lines 732 and between the controller and the one or more memory die 712 via lines 734. One implementation can include multiple chips 712.

On-die controller 720, in one embodiment, cooperates with the read/write circuits 730A/730B to perform memory operations on the memory array 700. The on-die controller 720, in certain embodiments, includes a state machine 722, an on-chip address decoder 724, and a power control circuit 726. In one embodiment, the on-chip address decoder 724 and/or the power control circuit 726 can be part of and/or controlled by the controller 744. The on-die controller 720 an operate to select certain single tiers for certain program verify levels and multiple tiers for other program verify levels.

The state machine 722, in one embodiment, provides chip-level control of memory operations. The on-chip address decoder 724 provides an address interface to convert between the address that is used by the host or a memory controller to the hardware address used by the decoder circuits 740A, 740B, 742A, 742B. The power control circuit 726 controls the power and voltages supplied to the word lines and bit lines during memory operations. In one embodiment, the power control circuit 726 includes one or more charge pumps that can create voltages larger than the supply voltage.

In an embodiment, one or any combination of the on-die controller 720, state machine 722, power control circuit 726, on-chip address decoder 724, decoder circuit 742 A, decoder circuit 742B, decoder circuit 740 A, decoder circuit 740B, read/write circuits 730 A, read/write circuits 730B, and/or controller 744 can be referred to as one or more managing circuits or generally as a controller circuitry. A dynamic tier selection circuit 750 is provided to select when a single tier is selected for verify or a plurality of tiers, less than all tiers, are used for program verify.

Figure 8:
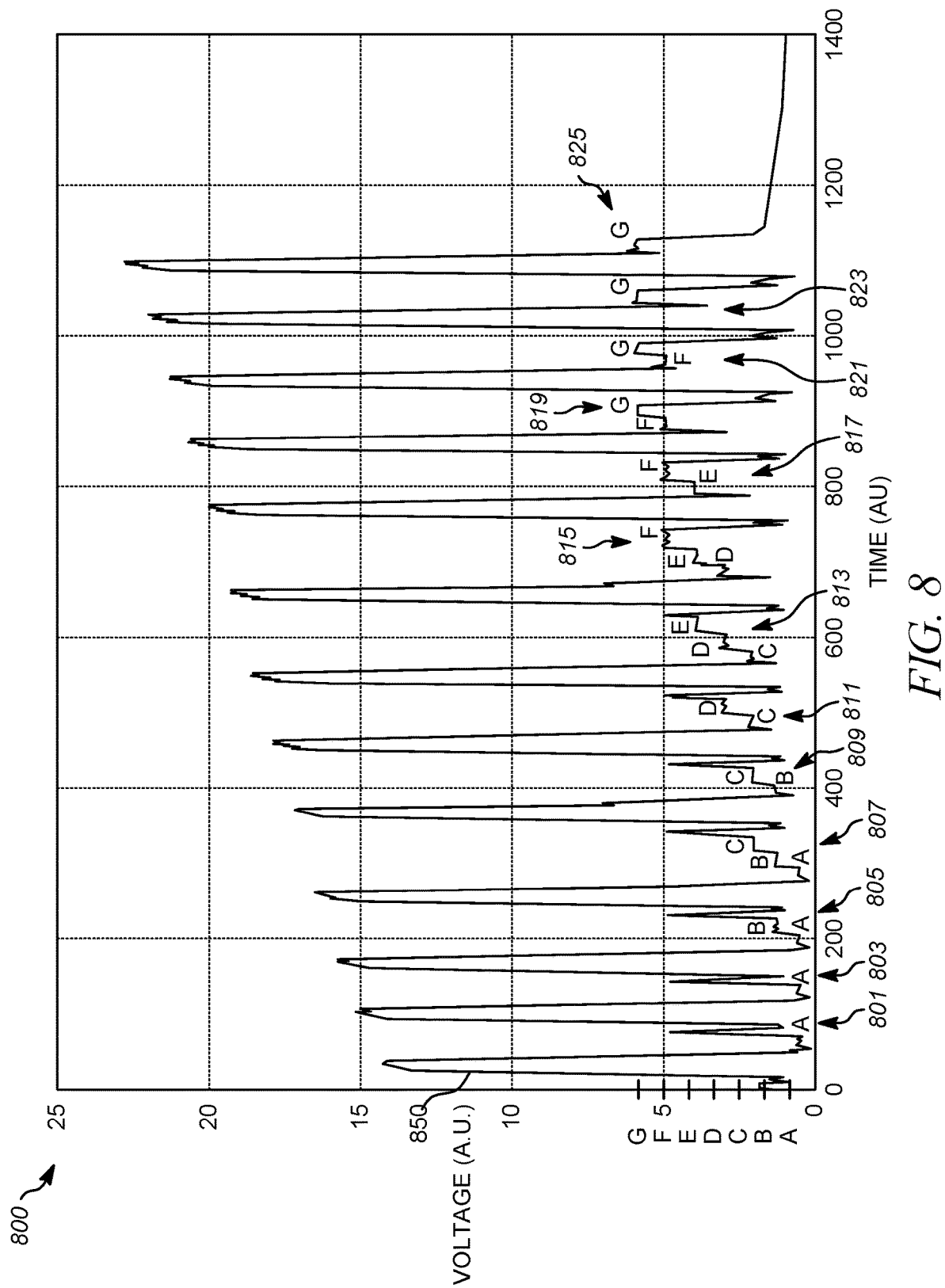
FIG. 8 illustrates a control gate signal spectrum according to an example embodiment.

FIG. 8 shows a diagram 800 of the signal level at the control gates as applied to the memory for a whole program operation. The diagram 800 shows a pulse train for program pulse, sometimes called an incremental step program pulse (ISPP), followed by program verify, in multiple loops. While the diagram 800 uses units like μs and volts, the present invention is not limited to these units of measure. The dynamic selection of tiers for use in program verify in nonvolatile memories can be performed at different units, e.g., time and voltage. The units are representative of an example embodiment. The signal 850 represents the voltage signal applied to the control gate of a memory cell to determine if the program of the memory cell is correct. The signal 850 includes a series of program pulses, which are the higher voltage peaks starting at just under fifteen volts and increasing to more than twenty volts. The signal 850 includes at least one or a series of program verify pulses (voltage levels) between each of the program peaks. The first verify pulse A is shown at for a first level, which is the lowest level. The second verify pulse B is for a second level, which is greater than the lowest level. The third verify pulse C is for a third level, which is greater than the second level. The fourth verify pulse D is for a fourth level, which is greater than the third level. The fifth verify pulse E is for a fifth level, which is greater than the fourth level. The sixth verify pulse F is for a sixth level, which is greater than the fifth level. The sixth verify pulse G is for a seventh level, which is greater than the sixth level. As shown a single level can be used to verify or more than one level can be used to verify with sequential levels.

The memory controller circuitry can generate the signal 850 and apply it was described herein. the present example is for a triple level cell storing three bits. The methodology also works with multiple level cells and quad level cells. The signal from the memory controller circuitry can output a pulse train with program pulses which increase stepwise in amplitude in one or more program loops or program loops of a programming pass using a fixed or varying step size. In some cases, the program pulses increase in each program loop after the first. This is an example of incremental step pulse programming. A new pulse train can be applied in each programming pass, starting at an initial level and ending at a final level which does not exceed a maximum allowed level. The initial levels can be the same or different in different programming passes. The final levels can also be the same or different in different programming passes. The step size can be the same or different in the different programming passes. In some cases, a smaller step size is used in a final programming pass to reduce Vth distribution widths.

At 801, the program verify signal is at the A level for program verify after the initial program pulse. The signal 801 is applied to a single tier of the memory. The single tier is selected to represent the all tiers. For example, a single tier, e.g., 2o or 3e can represent all of the sixteen tiers in the memory. In a further example embodiment, the A program verify pulse is applied to two or less than half of the tiers based on dynamic selection from the controller circuitry, e.g., tier selection circuit. These selected tiers represent the state of all of the tiers.

At 803, the signal can be applied to multiple tiers at the A level. The multiple tiers can be all of the tiers in an embodiment, e.g., 0o-7e. In an example embodiment, the multiple tiers receiving the A level signal are at least two tiers, e.g., both 2o and 3e.

At 805, the signal includes both an A level signal and a B level signal. The A level signal is applied to multiple tiers. The B level signal applied to a single tier, e.g., either the 2o tier or 3e tier. In a further example embodiment, the B program verify pulse is applied to two or less than half of the tiers based on dynamic selection from the controller circuitry, e.g., tier selection circuit. These selected tiers represent the state of all of the tiers.

At 807, the signal includes an A level signal, a B level signal, and a C level signal. The A level signal and the B level signal are applied to multiple tiers. The C level signal applied to a single tier, e.g., either the 2o tier or 3e tier. In a further example embodiment, the C program verify pulse is applied to two or less than half of the tiers based on dynamic selection from the controller circuitry, e.g., tier selection circuit. These selected tiers represent the state of all of the tiers.

At 809, the signal includes both a B level signal and a C level signal. The B level signal and the C level signal are both applied to multiple tiers. In an example embodiment, the B and C level verify pulses are applied to all of the tiers.

At 811, the signal includes both a C level signal and a D level signal. The C level signal is applied to multiple tiers. The D level signal applied to a single tier, e.g., either the 2o tier or 3e tier. In a further example embodiment, the D program verify pulse is applied to two or less than half of the tiers based on dynamic selection from the controller circuitry, e.g., tier selection circuit. These selected tiers represent the state of all of the tiers.

At 813, the signal includes a C level signal, a D level signal, and an E level signal. The C level signal and the D level signal are applied to multiple tiers. The E level signal applied to a single tier, e.g., either the 2o tier or 3e tier. In a further example embodiment, the E program verify pulse is applied to two or less than half of the tiers based on dynamic selection from the controller circuitry, e.g., tier selection circuit. These selected tiers represent the state of all of the tiers.

At 815, the signal includes a D level signal, an E level signal, and an F level signal. The D level signal and the E level signal are applied to multiple tiers. The F level signal applied to a single tier, e.g., either the 2o tier or 3e tier. In a further example embodiment, the F program verify pulse is applied to two or less than half of the tiers based on dynamic selection from the controller circuitry, e.g., tier selection circuit. These selected tiers represent the state of all of the tiers.

At 817, the signal includes both an E level signal and a F level signal. The E level signal and the F level signal are both applied to multiple tiers.

At 819, the signal includes both an F level signal and a G level signal. The F level signal is applied to multiple tiers. The G level signal applied to a single tier, e.g., either the 2o tier or 3e tier. In a further example embodiment, the G program verify pulse is applied to two or less than half of the tiers based on dynamic selection from the controller circuitry, e.g., tier selection circuit. These selected tiers represent the state of all of the tiers.

At 821, the signal includes both an F level signal and a G level signal. The F level signal and the G level signal are both applied to multiple tiers.

At 823, the signal can be applied to multiple tiers at the G level. The multiple tiers can be all of the tiers in an embodiment, e.g., 0o-7e. In an example embodiment, the multiple tiers receiving the G level signal are at least two tiers, e.g., both 2o and 3e. In a further example embodiment, the G program verify pulse is applied to two or less than half of the tiers based on dynamic selection from the controller circuitry, e.g., tier selection circuit. These selected tiers represent the state of all of the tiers.

At 825, the signal can be applied to multiple tiers at the G level. The multiple tiers can be all of the tiers in an embodiment, e.g., 0o-7e. In an example embodiment, the multiple tiers receiving the G level signal are at least two tiers, e.g., both 2o and 3e. In a further example embodiment, the G program verify pulse is applied to two or less than half of the tiers based on dynamic selection from the controller circuitry, e.g., tier selection circuit. These selected tiers represent the state of all of the tiers.

The above program verify signal can start at a single tier of memory cells for program verify to represent the state of all the tiers. This can be a reduction of 16:1. At the beginning of each level being applied to the program verify, that level is applied to a single tier. That is, when the A level is first used, it is applied to a single tier. When the B level is applied, it is applied to a single tier. When the C level is applied, it is applied to a single tier. This is repeated through G level in this example. Additional levels beyond G are within the scope of the present disclosure.

Figure 9:
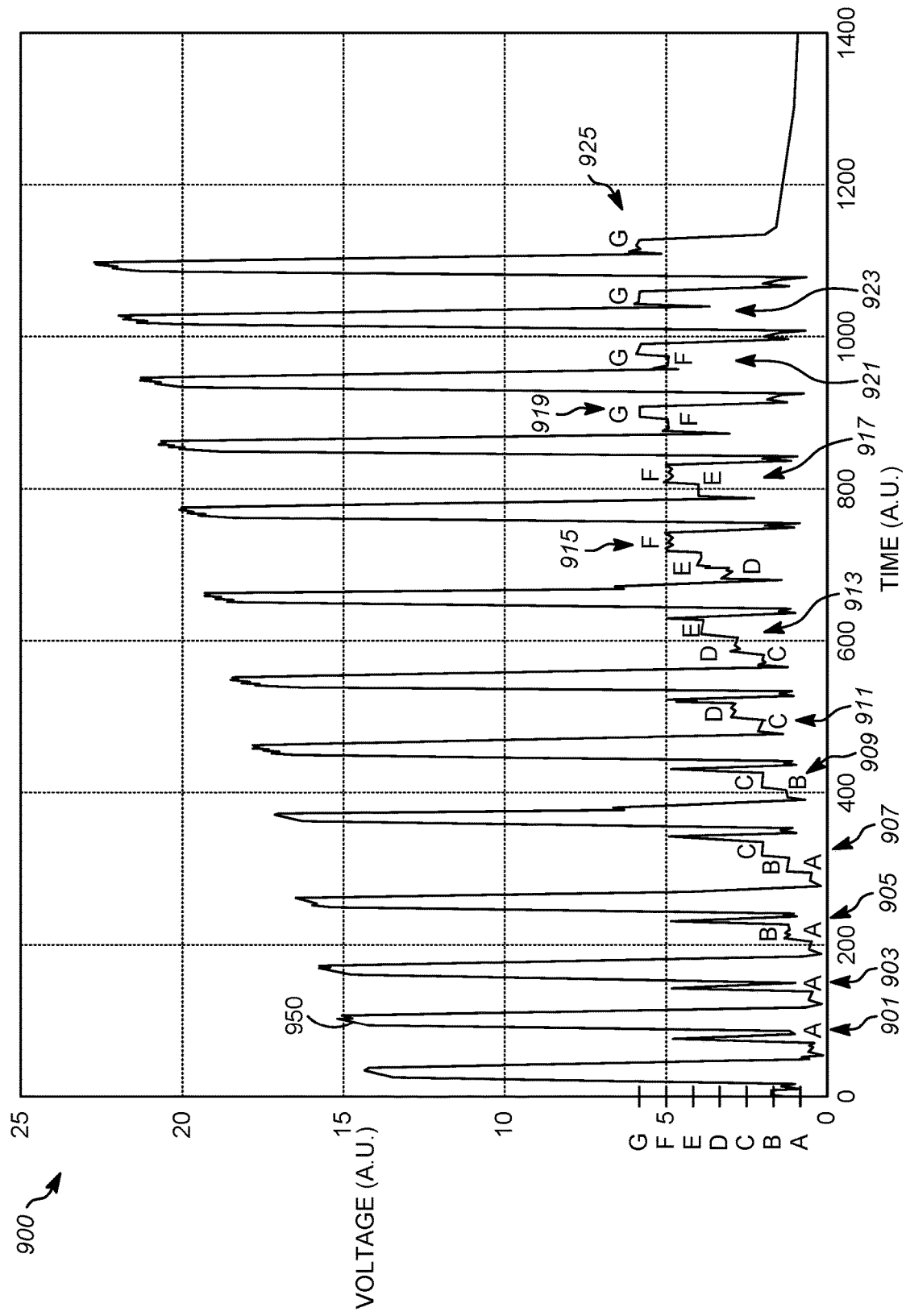
FIG. 9 illustrates control gate signal spectrum according to an example embodiment.

FIG. 9 shows diagram 900 of the signal level at the control gates as applied to the memory for a program verify operation. The diagram 900 shows a pulse train for program verify, which can be generated by the memory control circuitry. The signal represents the voltage signal applied to the control gate of a memory cell to determine if the program of the memory cell is correct. The memory controller circuitry can generate the signal and apply it was described herein. the present example is for a triple level cell storing three bits. The methodology also works with multiple level cells and quad-level cells.

The diagram 900 shows a pulse train for program pulse, sometimes called an incremental step program pulse (ISPP), followed by program verify, in multiple loops. While the diagram 900 uses units like μs and volts, the present invention is not limited to these units of measure. The dynamic selection of tiers for use in program verify in nonvolatile memories can be performed with different units. The units are representative of an example embodiment. The signal 950 represents the voltage signal applied to the control gate of a memory cell to determine if the program of the memory cell is correct. The signal 950 includes a series of program pulses, which are the higher voltage peaks starting at just under fifteen volts and increasing to more than twenty volts. The signal 950 includes at least one or a series of program verify pulses (voltage levels) between each of the program peaks. The signal 950 can be similar to signal 850 except as described herein At 901, the program verify signal is at the A level for program verify. The signal 901 is applied to a single tier of the memory. The single tier is selected to represent the all tiers. For example, a single tier, e.g., 2o or 3e can represent all of the sixteen tiers in the memory.

At 903, the signal can be applied to a single tier at the A level. The single tier is selected to represent the all tiers. For example, a single tier, e.g., 2o or 3e can represent all of the sixteen tiers in the memory.

At 905, the signal includes both an A level signal and a B level signal. The A level signal is applied to a single tier. The B level signal applied to a single tier, e.g., either the 2o tier or 3e tier. The single tier for the B level can be the same tier to which the A level signal is applied.

At 907, the signal includes an A level signal, a B level signal, and a C level signal. The A level signal and the B level signal are applied to a single tier. The C level signal applied to multiple tiers, e.g., both the 2o tier or 3e tier. The multiple tiers receiving the C level signal can include the same tier to which the A level and B level signals are applied.

At 909, the signal includes both a B level signal and a C level signal. The B level signal is applied to a single tier. The C level signal is applied to multiple tiers. The multiple tiers receiving the C level signal can include the same tier to which the B level signal is applied.

At 911, the signal includes a C level signal and a D level signal. The C level signal and the D level signal are applied to multiple tiers. The multiple tiers for the C level and D level signals can overlap tiers or be the same tiers.

At 913, the signal includes a C level signal, a D level signal and an E level signal. The C level signal, D level signal and the E level signal are applied to multiple tiers. The multiple tiers for the C level signal, the D level signal, and the E level signals can overlap tiers or be the same tiers.

At 915, the signal includes a D level signal, E level signal, and an F level signal. The D level signal and the E level signal are applied to multiple tiers. The multiple tiers for the D level and E level signals can overlap tiers or be the same tiers. The F level signal is applied to a single tier.

At 917, the signal includes an E level signal and an F level signal. The E level signal is applied to multiple tiers. The F level signal is applied to a single tier. The F level signal can overlap with the E level signal and be on a same tier.

At 919, the signal includes both an F level signal and a G level signal. The F level signal is applied to a single tier. The G level signal applied to a single tier, e.g., either the 2o tier or 3e tier. The single tier for the G level can be the same tier to which the F level signal is applied.

At 921, the signal includes both an F level signal and a G level signal. The F level signal is applied to a single tier. The G level signal applied to a single tier, e.g., either the 2o tier or 3e tier. The single tier for the G level can be the same tier to which the F level signal is applied.

At 923, the signal can be applied to a single tier at the G level. The single tier is selected to represent the all tiers. For example, a single tier, e.g., 2o or 3e can represent all of the sixteen tiers in the memory.

At 925, the signal can be applied to a single tier at the G level. The single tier is selected to represent the all tiers. For example, a single tier, e.g., 2o or 3e can represent all of the sixteen tiers in the memory.

In example embodiments, only over program risk states use more than a single tier scan and the rest of states use a single tier scan. As shown in diagram 900, states A, B, F and G all use single tier scans. The states C, D and E all use multiple tier scans as these states are at risk of over program. If over program risk states only occur at A and B states, then, A and B uses multiple tiers scan and others use single tier scan. Over program risk states can be just one state, or two states in some examples. The over program risk states can be stored in the memory of the memory controller.

The two proposals 800, 900 for program verify can be combined to gain more performance. For example, the first verify for C, D and E states can use a single tier scan and the following verify of the same state uses more than a single tier scan.

The single tier for each level can be selected as a default tier. This tier can be programmed into the memory controller and can be determined based on statistical analysis from fabricated memories.

It will be recognized that in the present examples as shown in FIGS. 8 and 9 that the voltage level increases with the alphabetic indicator, e.g., A level is less than the B level, the B level is less than the C level, etc. on up to the maximum level of the G level. The instances where the voltage level is applied to a single tier, then the time it takes for the single tier program verify is less than the time that the voltage level is applied to multiple tiers.

Figure 10:
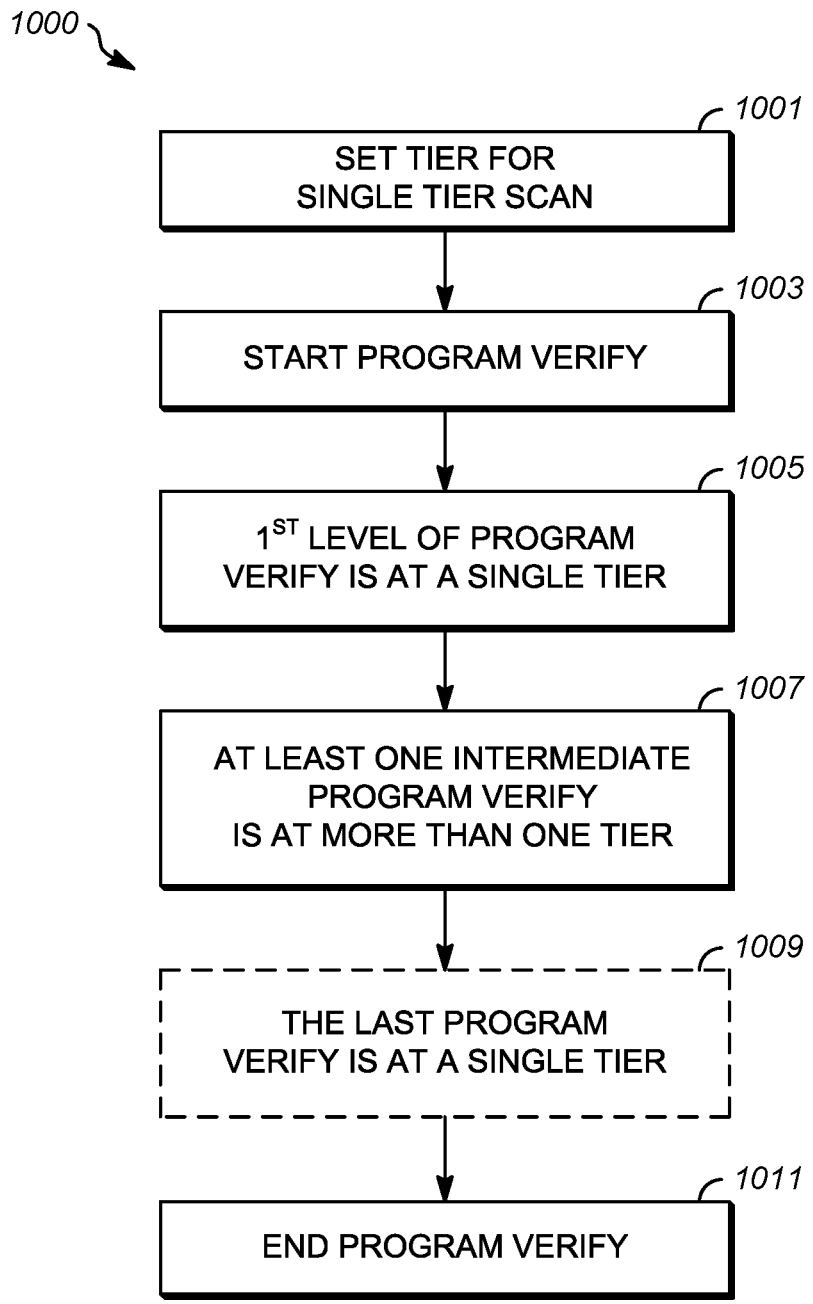
FIG. 10 illustrates a process flow for dynamic tier selection for program verify operations.

FIG. 10 shows a process flow 1000 for using both single tier and multiple tier program verify operations according to an example embodiment. At 1001, the levels for program verify that can use a single tier scan are set. The single tier scan can be for any of the program states that can be verified using a single tier to represent the other tiers in that portion of memory being address by the memory control circuitry. This can be determined by statistical analysis of the fabrication of the same type of memory. At least the first state (voltage level, e.g., A voltage level in FIGS. 8 and 9) for the programmed level of the memory cell can be applied to a single tier. Other states can also be set to use a single tier for program verify. At least one state will use multiple tiers. Hence, not all of the program verify states use a single tier for program verify. For example, the intermediate states, e.g., C level, D level and E level can use multiple tiers. Accordingly, A level uses a single tier and B level, F level and G may use a single tier for program verify.

At 1003, program verify begins after a programming operation on the group of memory cells controlled by the memory control circuitry. The programming operation can be programming multi-level cells.

At 1005, the first program verify level (e.g., at the control gate) is applied to a single tier which is presentative of all the other tiers, sixteen tiers in the examples illustrated herein.

In an alternative embodiment, if the memory system determines that there is a likelihood overprogram in the A or B states, then the memory can use the A or B state across multiple tiers for program verify. Other states can use the single tier scan At 1007, at least one intermediate program verify level is applied to multiple tiers. The intermediate program levels are not levels A or G.

At 1009, optionally, the last or highest voltage program verify level is performed on a single tier.

At 1011, the program verify is completed and ends.

Figure 11:
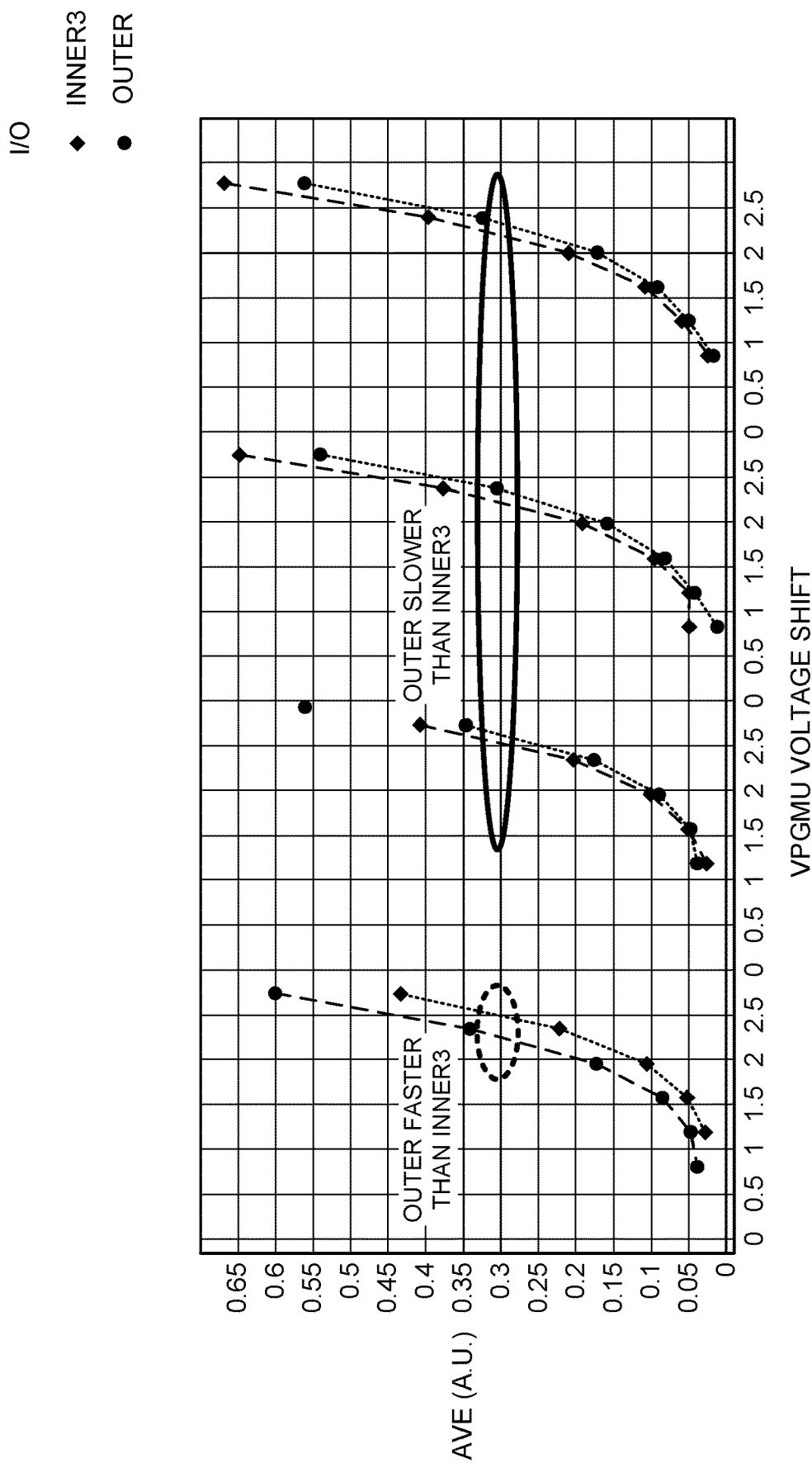
FIG. 11 illustrates an example of a graph showing performance of the various IO's in nonvolatile memory e.g., NAND.

FIG. 11 shows a graph 1100 of the results from non-volatile memory, e.g., NAND, BiCS or the like, testing. For program verify the slowest IO is to be selected for program verify. The IO choices are the outer, inner1, inner2 or inner3. This is selected to ensure each page is programmed correctly. The outer IO is the slowest IO from the four IO groups. As described herein, a tier can be selected to represent the other tiers during program verify. The first (leftmost) graph shows that the outer IO is faster than the inner3 IO. The other graphs show that the outer IO is slower than the inner3 IO. The memory device can be programmed to default to the outer IO being the program verify group. However, as shown in FIG. 11 for some memory dies, the slowest IO is actually the inner3 IO due to fabrication variation and wordline dependence. As a result, the default setting of the outer IO being the default when in fact the inner3 IO is slowest may result in over program issues of some memory cells, e.g., the G-state lower tail issue as well as FBC. Thus, the present paper recognizes the need to select a single tier scan or less than all tiers in the correct IO.

Figure 12:
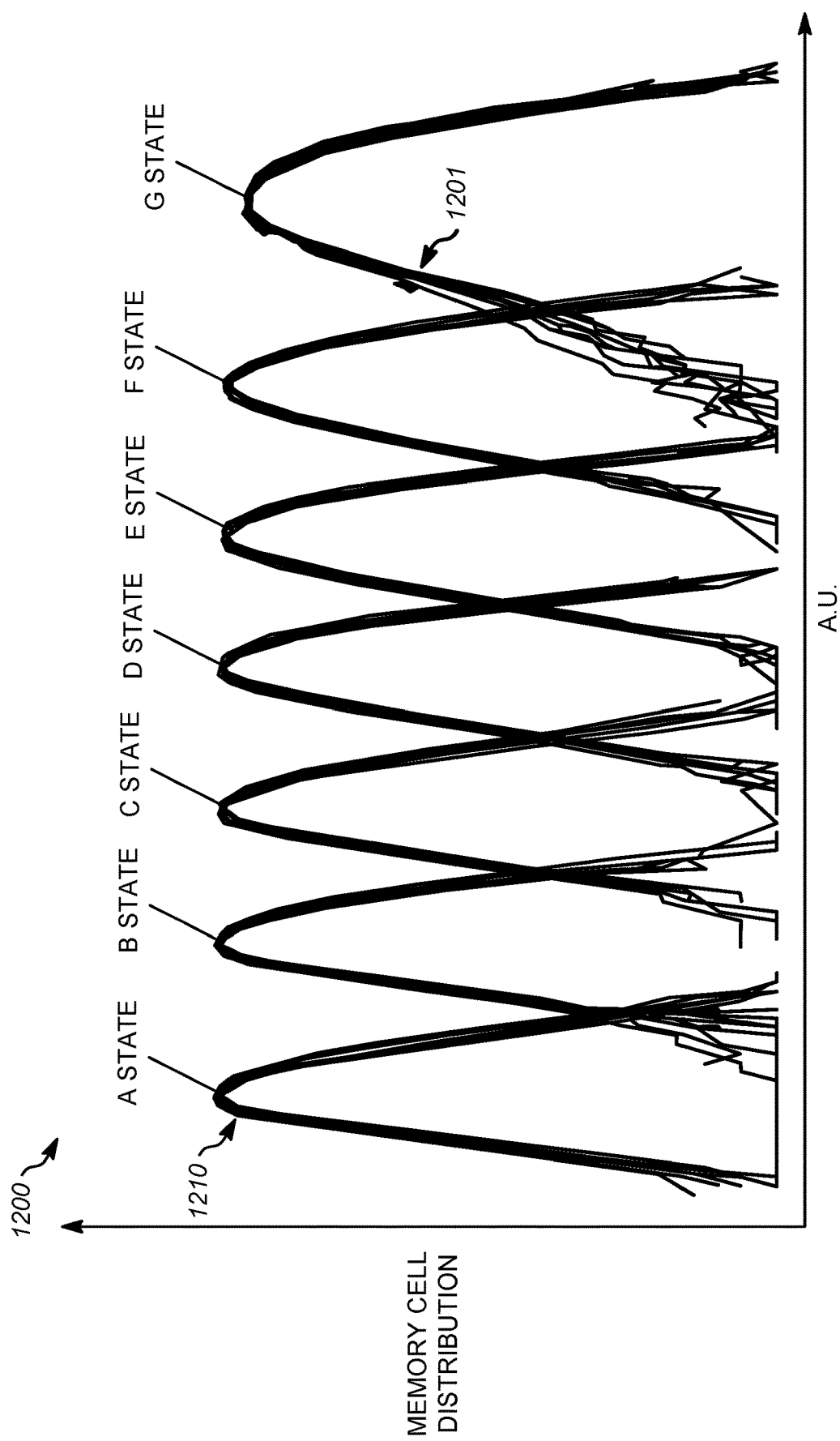
FIG. 12 illustrates a graph showing problem states in the memory cells that can be addressed according to the present disclosure.

While performing program verify, it is more favorable to select a single tier scan instead of multiple tiers scan for performance considerations. However, choosing and inappropriate tier scan can lead to over program (OP) issue for lower states (such as A, B or C-States, see FIG. 13 for an example) or G-State lower tail issue (FIG. 12). These issues are identified to be a program speed difference between inner and outer memory holes in various non-volatile memory, e.g., NAND, BiCS or the like.

Figure 13:
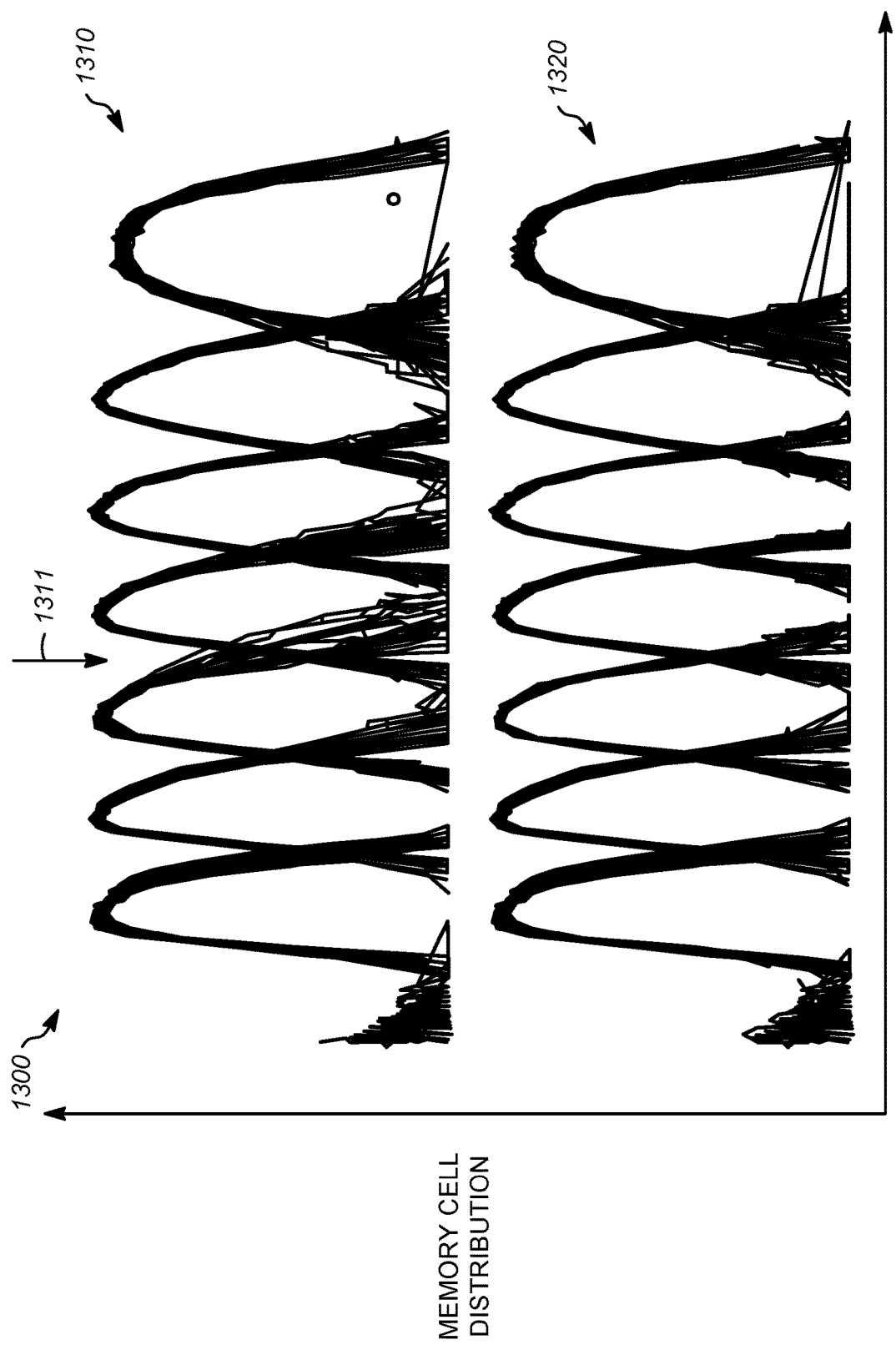
FIG. 13 illustrates a graph showing problem states in the memory cells that can be addressed according to the present disclosure.

FIG. 12 illustrates a graph including a first set of memory cell distributions 1210 generated using a conventional scan of all tiers. FIG. 13 illustrates a graph 1300 with a first set of memory cell distributions 1310 and a second set of memory cell distributions 1320 generated using scan of all tiers (in which all of the memory cells are counted—i.e., scanned). Such an all-subgroup scan produces an acceptable set of distributions 1320, but scanning all of the subgroups is too time-consuming and results in a slower programming or erasing process. In contrast, the conventional single-subgroup scan produces a poor set of distributions 1210. The arrow 1201 in FIG. 12 identifies an area in the first set of distributions 1210 in which insufficient programming as illustrated in the G state with its lower tail moving toward the left. With reference to FIG. 13, please note how some of the upper tails in the memory cell distribution 1310 set indicated by the arrow 1311 (the C state) appear to spread out and move towards the right in FIG. 13 into the next highest state, which is known as over programming. By comparison, the second set of memory cell distributions 1210 does not exhibit these programming errors. Likewise, for under programming errors (illustrated in the FIG. 12), the lower tails of a memory cell distribution set would appear to spread out and move towards the left in FIG. 12, into an adjacent and lower distribution, e.g., as shown in arrow 1201. It should also be noted that under programming error occurs in the highest state (G state for TLC) but over programming errors can occur in any intermediary data states such as A state, B state, . . . , etc.

During a verification process it is time-consuming to count the entire population of memory cells for each tier. Accordingly, less than all tiers (e.g., a single tier or two tiers in a single state) can be selected for scanning (i.e., program verify). Scanning is utilized to verify the programming status (or current state) of memory cells, for example, during a programming procedure. As example of programming is shown in FUGS. 8 and 9. Scanning is done to determine whether the memory cells have reached a target data state or threshold. When the target programming threshold is reached, programming for those cells can be stopped; if the target programming threshold has not been reached, programming will continue until the target is reached. Thus, in one embodiment, one or more initial program pulses followed by scanning can be used during a programming procedure to ascertain which set of memory cells to select for scanning operations, e.g., select a representative tier of memory cells. Alternatively, a tier of memory cells can be selected based on information obtained from a prior programming procedure, such as during a manufacturing or calibration procedure.

In certain 3D NAND flash technology, the program verify operation can use a single or one tier program verify method, meaning a controller scans only a single tier or less than all tiers as describe herein on a page of data to determine whether a target programming level (or threshold) has been reached instead of instead of scanning all of the cells on the page. It should be noted that whether a one tier program verify can be selected for a single state or a single programming loop. In one embodiment, the memory cells of a page are organized into subgroups of memory cells (e.g., tiers). For example, if a page includes 16 KB of memory cells, the page can be divided into 16 tiers, with each tier including 1 KB of memory cells of the page. A single tier program verify operation may select one tier, out of the 16 tiers, to perform a representative program verify operation that serves to verify all other tiers based on the assumption that the selected tier exhibits a desired relative programming speed for the program verify operation. Thus, ideally, the behavior of the selected tier makes it a good representative for all other tiers that together comprise the whole page.

In an embodiment of a 3D memory architecture (e.g., shown in FIGS. 4 and 5), the memory cells can be organized into four IO groups (e.g., an inner1 IO, an inner2 IO, an inner3 IO, an outer IO, or the like). Outer IO groups can be those memory cells that are physically located along the outer edges of the array of memory cells (adjacent to a deep etching), and Inner I0 groups can be those memory cells that are physically located nearer the center of the array of memory cells (adjacent to a shallow etching). In one embodiment of a single tier program verify method, an outer I0 group or an inner I0 group can be selected to be a default I0 group representative of other I0 groups during a program verify operation. In such an embodiment, the default I0 group can always be used to perform certain program verify operations, such that the other unselected I0 groups do not need to undergo the same program verify operations, as it is assumed and believed that the results of the program verify operations for the default I0 group can be relied upon as a good representative for all other I0 groups. For example, a representative default I0 group can be assumed to be a fastest (or slowest) programming subgroup of memory cells among a plurality of subgroups.

In another embodiment, selecting the fastest I0 group for certain program operations can ensure that memory cells are not over programmed in order to avoid the over programming errors previously discussed. If, however, a slower I0 group is erroneously selected to represent all I0 groups for certain program operations, the memory array can exhibit over programming errors (e.g., a memory cell distribution with an extended and/or improper upper tail) after the program operation has finished.

The presently described systems and methods improves on the program verify for multi-level cells, to determine the upper and lower tails of against programmed bits and read the threshold voltage (Vt) to confirm programming. However, there is a tradeoff between tprog (performance) vs. A-F Vt width, which is related to reliability for typical memory chip. Upon analysis, a fitting curve has shown that a one volt Vt window equals to Tprog of 377.86 µs or ~2.646 mV per 1 µs. In other words, the presently described system should gain the benefit of 2.646 mV Vt window with only a degradation of 1 µs Tprog.

The present description provides an improved trade-off between the threshold voltage (Vt) window versus program time (Tprog), which can be implemented for all the strings and wordlines (WLs). Depending on the setting of second or third program verify to use multiple tiers scanning, the present disclosure can have a reduces Tprog penalty.

Aspects of the present disclosure can be embodied as an apparatus, system, method, or computer program product. Accordingly, aspects of the present disclosure can take the form of an entirely hardware embodiment, an entirely software embodiment (including firmware, resident software, micro-code, or the like) or an embodiment combining software and hardware aspects that can all generally be referred to herein as a "circuit," "module," "apparatus," or "system." Furthermore, aspects of the present disclosure can take the form of a computer program product embodied in one or more non-transitory computer readable storage media storing computer readable and/or executable program code.

Many of the functional units described in this specification have been labeled as modules in order to more particularly emphasize their implementation independence. For example, a module can be implemented as a hardware circuit comprising custom VLSI circuits or gate arrays, off-the-shelf semiconductors such as logic chips, transistors, or other discrete components. A module can also be implemented in programmable hardware devices such as field programmable gate arrays, programmable array logic, programmable logic devices, or the like.

Modules can also be implemented at least partially in software for execution by various types of processors. An identified module of executable code can, for instance, comprise one or more physical or logical blocks of computer instructions which can, for instance, be organized as an object, procedure, or function. Nevertheless, the executables of an identified module need not be physically located together but can comprise disparate instructions stored in different locations which, when joined logically together, comprise the module and achieve the stated purpose for the module.

Indeed, a module of executable code can include a single instruction, or many instructions, and can even be distributed over several different code segments, among different programs, across several memory devices, or the like. Where a module or portions of a module are implemented in software, the software portions can be stored on one or more computer readable and/or executable storage media. Any combination of one or more computer readable storage media can be utilized. A computer readable storage medium can include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium can be any tangible and/or non-transitory medium that can contain or store a program for use by or in connection with an instruction execution system, apparatus, processor, or device.

Computer program code for carrying out operations for aspects of the present disclosure can be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code can execute partly or entirely on one or more of a user's computer and/or on a remote computer or server over a data network or the like. A component, as used herein, comprises a tangible, physical, non-transitory device. For example, a component can be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component can also be implemented in programmable hardware devices such as field programmable gate arrays, programmable array logic, programmable logic devices, or the like. A component can comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, can alternatively be embodied by or implemented as a component.

A circuit or circuitry, as used herein, comprises a set of one or more electrical and/or electronic components providing one or more pathways for electrical current. In certain embodiments, a circuit can include a return pathway for electrical current, so that the circuit is a closed loop. In another embodiment, however, a set of components that does not include a return pathway for electrical current can be referred to as a circuit (e.g., an open loop). For example, an integrated circuit can be referred to as a circuit regardless of whether the integrated circuit is coupled to ground (as a return pathway for electrical current) or not. In various embodiments, a circuit can include a portion of an integrated circuit, an integrated circuit, a set of integrated circuits, a set of non-integrated electrical and/or electrical components with or without integrated circuit devices, or the like. In an embodiment, a circuit can include custom VLSI circuits, gate arrays, logic circuits, or other integrated circuits; off-the-shelf semiconductors such as logic chips, transistors, or other discrete devices; and/or other mechanical or electrical devices. A circuit can also be implemented as a synthesized circuit in a programmable hardware device such as field programmable gate array, programmable array logic, programmable logic device, or the like (e.g., as firmware, a netlist, or the like). A circuit can comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, can be embodied by or implemented as a circuit.

By way of introduction, the following brief definitions are provided for various terms used in this application. Additional definitions will be provided in the context of the discussion of the figures herein. As used herein, "exemplary" can indicate an example, an implementation, and/or an aspect, and should not be construed as limiting or as indicating a preference or a preferred implementation. Further, it is to be appreciated that certain ordinal terms (e.g., "first" or "second") can be provided for identification and ease of reference and may not necessarily imply physical characteristics or ordering. Therefore, as used herein, an ordinal term (e.g., "first," "second," "third") used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") can indicate "one or more" rather than "one." As used herein, a structure or operation that "comprises" or "includes" an element can include one or more other elements not explicitly recited. Thus, the terms "including," "comprising," "having," and variations thereof signify "including but not limited to" unless expressly specified otherwise. The terms "a," "an," and "the" also refer to "one or more" unless expressly specified otherwise. Further, an operation performed "based on" a condition or event can also be performed based on one or more other conditions or events not explicitly recited. As used in this application, the terms "an embodiment," "one embodiment," "another embodiment," or analogous language do not refer to a single variation of the disclosed subject matter; instead, this language refers to variations of the disclosed subject matter that can be applied and used with a number of different implementations of the disclosed subject matter. An enumerated listing of items does not imply that any or all of the items are mutually exclusive and/or mutually inclusive, unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions can be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. Other steps and methods can be conceived that are equivalent in function, logic, or effect to one or more blocks, or portions thereof, of the illustrated figures. Although various arrow types and line types can be employed in the flowchart and/or block diagrams, they are understood not to limit the scope of the corresponding embodiments. For instance, an arrow can indicate a waiting or monitoring period of unspecified duration between enumerated steps of the depicted embodiment.

As used herein, a "memory cell" comprises a hardware component that may store a single state. The memory cell may comprise a volatile or a non-volatile memory cell. The state stored in memory cell may represent one of various types of values, such as a single-bit value or a multi-bit value In the preceding detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure can refer to elements of proceeding figures. Like numbers can refer to like elements in the figures, including alternate embodiments of like elements.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a memory control circuitry;
a plurality of memory cells arranged in tiers; and
the memory control circuitry being configured to:
  program data into the plurality of memory cells; and
  perform a program verify operation across multiple voltage levels with a first voltage level of the program verify operation being applied to a single tier that represents all of the tiers in the memory group and a second voltage level of the program verify operation being applied to multiple tiers, wherein the first voltage level is associated with one programmed data state and is less than the second voltage level which is associated with another programmed data state.

2. The apparatus of claim 1, wherein the memory control circuitry is configured to program verify at a third voltage level at a single tier, the third voltage level being greater than the second voltage level.

3. The apparatus of claim 2, wherein the single tier at third voltage is the same single tier that received the first voltage level.

4. The apparatus of claim 3, wherein the memory control circuitry applies the first voltage level, the second voltage level and the third voltage level at a control gate of the tiers.

5. The apparatus of claim 4, wherein the memory control circuitry is further configured to select a single tier that represents the program state of the other tiers.

6. The apparatus of claim 2, wherein the first voltage level is to verify an A state in the memory cells, and the third voltage level is to verify the G state of the memory cells.

7. The apparatus of claim 1 wherein the memory control circuitry is configured to apply a first instance of each voltage level in the program verify process to a single tier.

8. The apparatus of claim 1, wherein the memory control circuitry is configured to apply an A level, a B level, an F level and a G level to a single tier and to apply a C level, a D level and an E level to multiple tiers.

9. The apparatus of claim 8, wherein each application of the A level, the B level, the F level and the G level to the single tier are to a same tier.

10. The apparatus of claim 1, wherein the memory cells are multiple level memory cells storing greater than one bit.

11. The apparatus of claim 1 wherein each tier comprises a group of memory cells in electrical communication with a unique bit line.

12. A dynamic tier selection method for nonvolatile memory, comprising:
programming a multilevel cell memory array that includes multiple tiers;
performing a program verify including:
  applying a first level of a program verify signal to a single tier of the memory cells;
  applying an intermediate level of the program verify signal to a plurality of tiers of the memory cells; and
  wherein the first level is associated with one programmed data state and the intermediate level is associated with another programmed data state.

13. The method of claim 12, wherein performing a program verify includes applying a second level of the program verify signal to a single tier of the memory cells and applying a last level of the program verify signal to a single tier of the memory cells.

14. The method of claim 13, wherein performing a program verify includes applying each instance of the first level of the program verify signal to the single tier of the memory cells and applying each instance of the last level of the program verify signal to the single tier of the memory cells.

15. The method of claim 14, wherein the single tier of memory cells are the same tier of memory cells.

16. The method of claim 12, wherein performing a program verify includes applying a first instance of a voltage level for each program verify state to the single tier.

17. The method of claim 12 wherein each tier comprises a group of memory cells in electrical communication with a unique bit line.

18. A dynamic tier selection method for nonvolatile memory, comprising:
programming a multilevel cell memory array that includes multiple tiers; and
performing a program verify including:
  applying a first level of a program verify signal to a single tier of the memory cells and applying a second level of the program verify signal to the single tier of the memory cells and applying a last level of the program verify signal to the single tier of the memory cells;
  applying intermediate levels of the program verify signal to a plurality of tiers of the memory cells; and
  wherein the intermediate levels are C level, a D level and an E level.

19. The method of claim 18, wherein the memory cells are triple bit memory cells, wherein the first level is the A level, and wherein at least one of an C level, a D level, and an E level are the intermediate level.

20. The method of claim 19, wherein the single tier is set in the memory control circuitry.

\* \* \* \* \*